United States Patent [19]
Endo et al.

[11] Patent Number: 6,165,386
[45] Date of Patent: Dec. 26, 2000

[54] PHOTOSETTING CONDUCTIVE PASTE

[75] Inventors: Yasuhiro Endo; Yasuo Kagami, both of Tokyo; Toru Maruyama, Saitama-ken; Kazunari Kodama, Tokyo, all of Japan

[73] Assignee: Toppan Forms Co., Ltd., Tokyo, Japan

[21] Appl. No.: 09/408,231

[22] Filed: Sep. 29, 1999

[30]      Foreign Application Priority Data

| Sep. 30, 1998 | [JP] | Japan | 10-278959 |
|---|---|---|---|
| Jan. 29, 1999 | [JP] | Japan | 11-023130 |
| Jan. 29, 1999 | [JP] | Japan | 11-023133 |
| Mar. 31, 1999 | [JP] | Japan | 11-093968 |
| Apr. 30, 1999 | [JP] | Japan | 11-125306 |
| Apr. 30, 1999 | [JP] | Japan | 11-125307 |
| Apr. 30, 1999 | [JP] | Japan | 11-125309 |
| Apr. 30, 1999 | [JP] | Japan | 11-125312 |
| May 31, 1999 | [JP] | Japan | 11-152896 |
| Jul. 23, 1999 | [JP] | Japan | 11-209374 |

[51] Int. Cl.$^7$ ................................................ H01B 1/22
[52] U.S. Cl. .......................................... 252/500; 252/514
[58] Field of Search ................................. 252/500, 512, 252/513, 514

[56]              References Cited

U.S. PATENT DOCUMENTS 3,767,519  10/1973  Kojima et al. .............................. 161/168
5,951,918   9/1999  Kuwajima et al. ........................ 252/514

FOREIGN PATENT DOCUMENTS 5-166018  7/1993  Japan .
8-216570  8/1996  Japan .

OTHER PUBLICATIONS

Physics Table, 1986 ed. Maruzen, KK., p. 511 together with English translation.

Primary Examiner—Mark Kopec
Attorney, Agent, or Firm—Weingarten, Schurgin, Gagnebin & Hayes LLP

[57]              ABSTRACT

There is provided a photosetting conductive paste that has a surface resistance of no greater than 200 mΩ/sq. upon curing by light irradiation. The photosetting conductive paste comprises conductive powder and a photosetting resin composition in specific amounts. The conductive powder contains dendritic conductive powder and scaly conductive powder at 80% or greater of the total conductive powder, the dendritic conductive powder having a mean particle size of 0.05–1.0 μm, a specific surface area of 0.5–5.0 m$^2$/g, and the scaly conductive powder having a mean particle size of 1.0–10.0 μm and a specific surface area of 0.5–5.0 m$^2$/g, wherein the weight ratio of the dendritic conductive powder and scaly conductive powder is 6/40–95/5. There is also provided a method of forming an antenna for a radio frequency identification medium that comprises printing the conductive paste on a substrate in an antenna-shaped pattern and curing it.

6 Claims, 10 Drawing Sheets

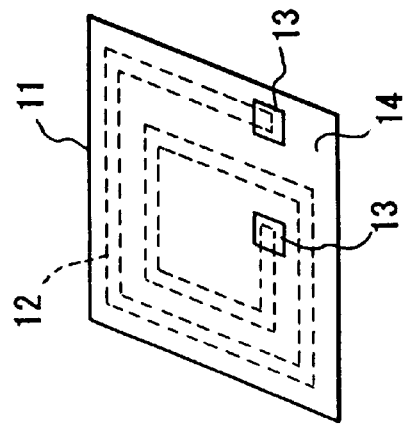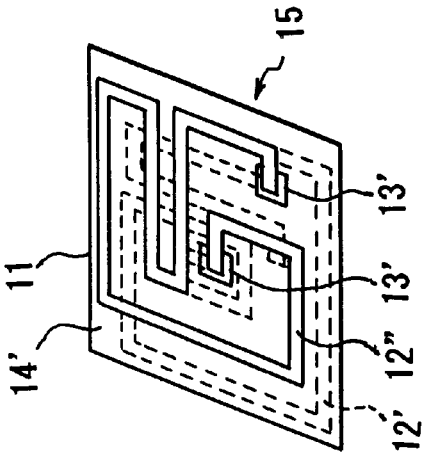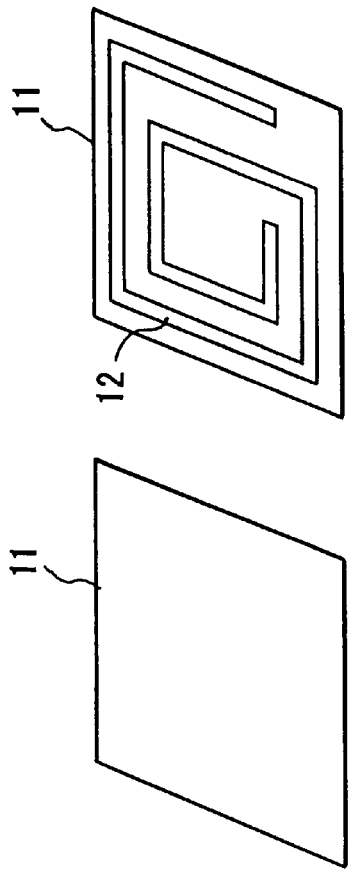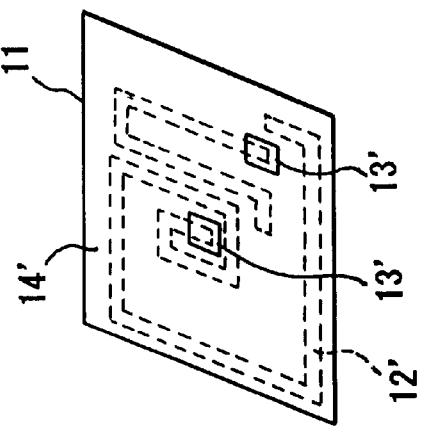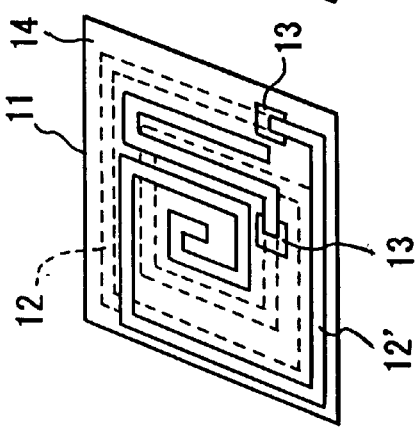

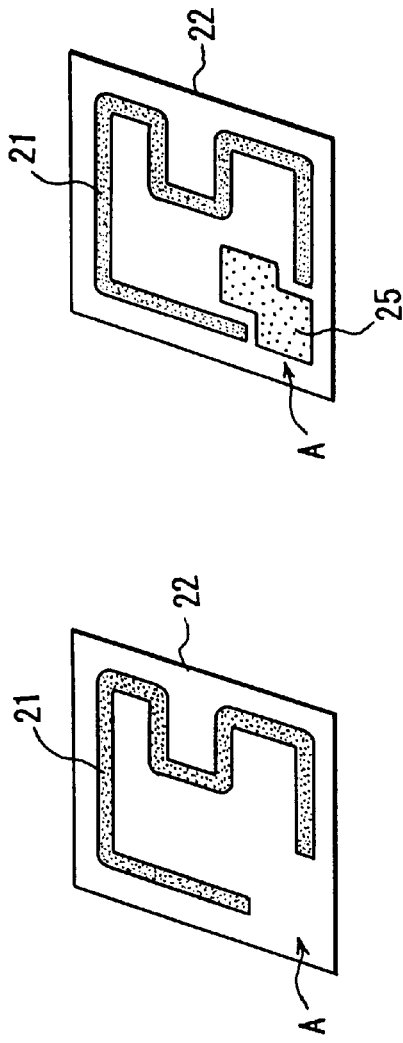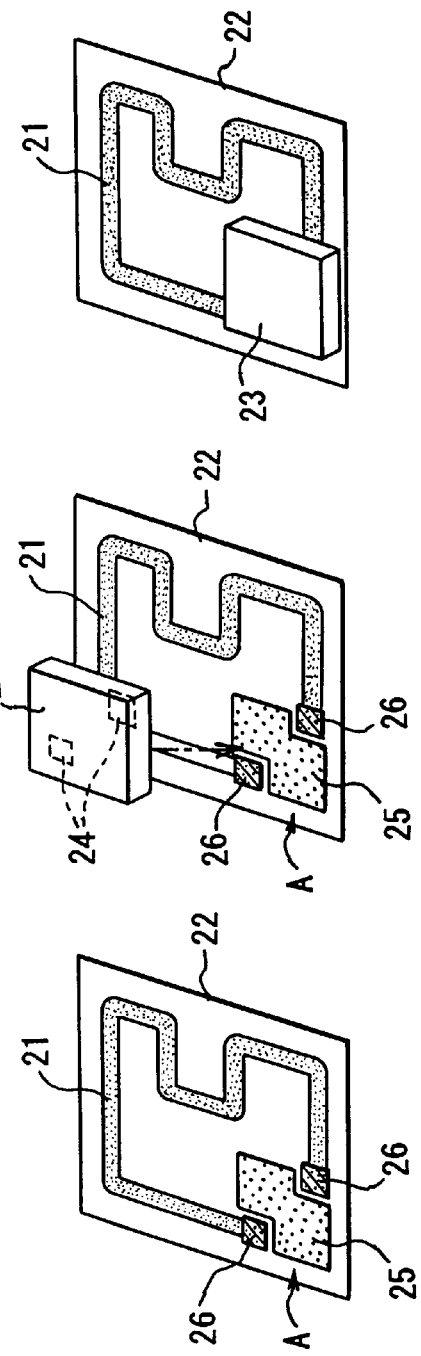

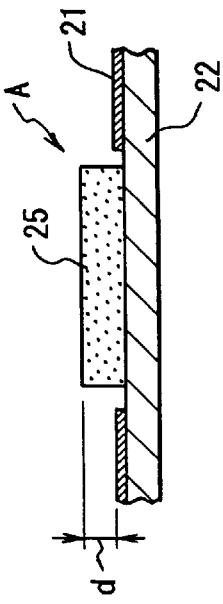
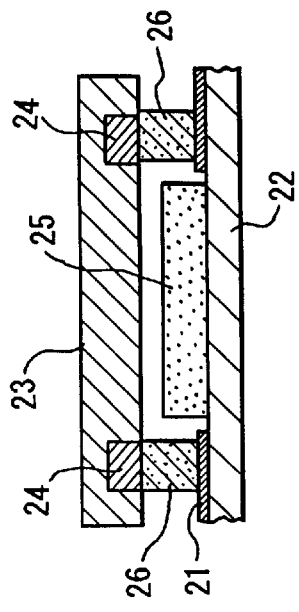
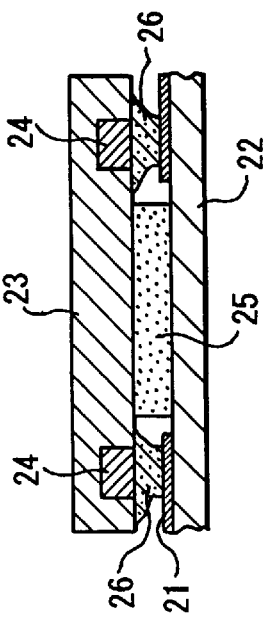
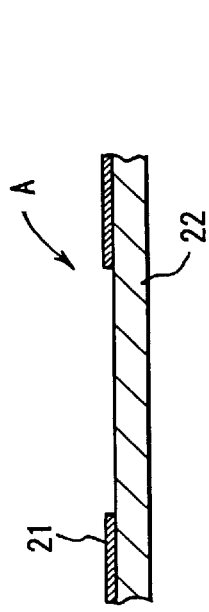
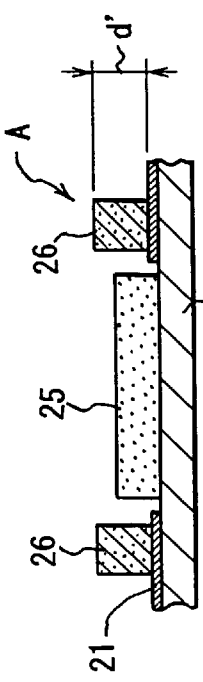
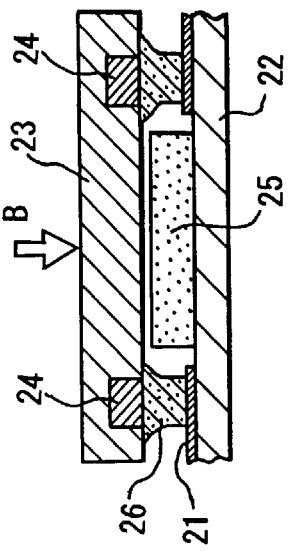

PHOTOSETTING CONDUCTIVE PASTE

BACKGROUND OF THE INVENTION

1. Field of the Invention

The present invention relates to a conductive paste and a conductive paste curing method, to a method of forming an antenna for a radio frequency identification medium employing the conductive paste, and to a radio frequency identification medium.

2. Background Art

Recent years have seen the development of radio frequency identification media such as so-called non-contact IC cards for use as ID cards, tags, name tags and the like, that allow reading out and writing in of data using read/write devices even at distances of 4–5 meters. Such non-contact IC cards are disclosed in Japanese Patent Application Laid-open No. 5-166018, Japanese Patent Application Laid-open No. 8-216570 and elsewhere. This type of radio frequency identification media is formed comprising a substrate and a coating member, and sandwiched therebetween an antenna for transmitting and receiving data utilizing electromagnetic waves as the transmission medium, with an IC chip having built-in functions allowing writing and storage of the data, as well as write-over and erasing.

A radio frequency identification medium, being typically just such a non-contact IC card, requires the antenna connected to the IC chip to have a thin shape. Methods employed to form such antennas include vapor deposition methods whereby a metal is directly vapor deposited onto a substrate and etching methods whereby a metal thin-layer is preformed on a substrate and then etched, as well as coil bonding methods whereby a separately formed coil is bonded to a substrate, and printing methods whereby a conductive paste is printed onto a substrate in an antenna shape to form the antenna.

Of these antenna-forming methods, the highest sensitivity thereof is exhibited by antennas formed by metal vapor deposition methods. However, when irregularities are present on the surface of the substrate during vapor deposition of the metal on the surface of the substrate, the surface condition has a direct influence to the deposition surface, resulting in irregularities on the metal vapor deposition surface. This has led to inconveniences including greater turbulence of the electromagnetic field distribution and lower sensitivity of the antenna.

Etching methods are antenna-forming methods that allow easy formation of any desired antenna shape. However, they have required many production steps including coating of the resists, patterning for the resists, and etching with etching solutions. In addition, the expensive equipment and working environment inevitably raises manufacturing costs. Another requirement is safe disposal of the large amounts of waste liquids generated during the etching step.

Antennas formed by coil bonding methods are superior in terms of sensitivity. However, workability therefor has been poor because the metal coil is bonded directly to the surface of the substrate. There are also many difficulties involved in reliably bonding metal coils to substrates, and therefore productivity has been inferior.

In this regard, the printing methods mentioned as above can easily form any desired shape of antenna by printing techniques, and they also allow satisfactory workability. Specifically, the productivity of the various manufacturing steps such as screen printing of conductive pastes, bonding of IC chips and antennas and attachment of coating sheets (or film lamination) can be improved by the performance of the printing machines themselves.

Currently, conductive layer formation for these antennas and the like is mostly carried out using thermosetting conductive pastes that are cured by heat. Such thermosetting conductive pastes usually contain solvents, and the performance is exhibited by evaporation of the solvent or by evaporation of the solvent coupled with curing of a binder resin. A phenol resin, polyester resin, or the like is used as the binder resin.

However, conductive layer formation with thermosetting conductive pastes requires heating at 150° C. or above and treatment times on the order of half an hour or longer. The processing time for formation of conductive layer formation for antennas, etc. is therefore longer. Furthermore, deterioration of the substrates on which the conductive layers are formed has also been unavoidable.

On the other hand, photosetting conductive pastes are also used for conductive layer formation. When photosetting conductive pastes are used, it is necessary to remove organic matters by sintering as post-treatment after the photosetting in order to improve the conductivity of the antenna. Thus, once the photosetting conductive paste has been fixed onto the substrate by light irradiation, the organic matters are decomposed and removed by post-heating at 500° C. or above to form the conductive layer. This post-heating is usually carried with an electric furnace. However, as mentioned above, since heating is carried out at 500° C. or above for the post-heating, only heat resistant materials such as ceramics can be used for the substrate on which the conductive layer is formed of the photosetting conductive paste. Consequently, materials with poor heat resistance, such as paper and plastics, are not suitable as the substrates.

Further, when a photosetting conductive paste is used, formation of hard cured products results in brittleness and poor bending resistance. Also, although the monomers have high reactivity, there is notable bleed-out after application, and while their oligomers can soften the cured products, their high viscosity during application makes it difficult to part them from plates, and thus it has been difficult to set the balance for application.

SUMMARY OF THE INVENTION

In the light of these circumstances, it is an object of the present invention to remove the occurrence of the deterioration of a substrate due to heat applied during the manufacturing of the radio frequency identification medium, to be capable of employing a material that has an inferior heat resistance as a substrate, and to improve productivity for radio frequency identification mediums, by providing a conductive paste and conductive paste curing method, a method of forming an antennas for a radio frequency identification medium employing the conductive paste, and a radio frequency identification medium, which are capable of resolving the aforementioned problems.

A first aspect of the present invention is to provide a photosetting conductive paste having a surface resistance of no greater than 200 mΩ/sq. upon curing by light irradiation, characterized in that the paste comprises conductive powder and a photosetting resin composition in a weight ratio of 50/50–95/5, and the conductive powder contains dendritic conductive powder and scaly conductive powder at 80% or greater of the total conductive powder, the dendritic conductive powder having a mean particle size of 0.05–1.0 $\mu$m, a specific surface area of 0.5–5.0 m$^2$/g and the scaly conductive powder having a mean particle size of 1.0–10.0 $\mu$m and a specific surface area of 0.5–5.0 m²/g, wherein the weight ratio of the dendritic conductive powder and scaly conductive powder is 60/40–95/5.

In the above-mentioned photosetting conductive paste, it is preferred that the photosetting resin composition contains a mixture of an aromatic sulfonium salt initiator and a non-aromatic epoxy resin combined in a weight ratio of 0.01/100–10/100.

Furthermore, in the above-mentioend photosetting conductive paste, it is preferred that the photosetting resin composition contains a mixture of at least one selected from the group consisting of a thioxanthone derivative, a thiobenzophenone derivative, an anthraquinone derivative and an acylphosphine oxide derivative, and at least one selected from the group consisting of an acrylate and a methacrylate, combined in a weight ratio of 0.01/100–10/100.

Furthermore, in the above-mentioned photosetting conductive paste, it is preferred that the paste further contains at least one processability of printing/bending ability improver selected from the group consisting of silica with a specific surface area of at least 100 m²/g, an apparent specific gravity of no greater than 50 g/l and a mean primary particle size of no greater than 30 nm, a saturated polyester resin with a softening temperature of 100° C. or below and a number average molecular weight of 1000–50,000, a poly-vinyl ether resin with a glass transition point (Tg) of –30° C. or below, and a phenoxy resin with a softening temperature of 100° C. or higher.

A second aspect of the present invention is to provide a photosetting conductive paste comprising silver powder, a photoreactive resin and at least one compound selected from the group consisting of a photosetting initiator and a photosensitizing agent, wherein the compound has a light absorption maximum in a wavelength range of 300–450 nm.

It is preferred that the photoreactive resin is at least one compound selected from the group consisting of an acrylate compound and a methacrylate compound.

Furthermore, the photoreactive resin may be at least one compound selected from the group consisting of an alicyclic epoxy compound, an oxetane compound, an alkene oxide compound, a glycidyl ether compound and a vinyl ether compound.

In the above-mentioned photosetting conductive paste, it is preferred that as the photosetting initiator or photosensitizing agent is used at least one selected from the group consisting of [4-methylphenylthio]phenyl] phenylmethanone, ethyl anthraquinone, 2,4-diethylthioxanthone, 2-chlorothioxanthone, 2-benzyl-2-dimethylamino-1-(4-morpholinophenyl)-1-butanone, 2,4-trichloromethyl-(4'-methoxynaphthyl)-6-triazine, 2,4-trichloromethyl-(4'-methoxystyryl)-6-triazine, isoamyl p-dimethylaminobenzoate and perylene.

Further, a third aspect of the present invention is to provide a conductive paste characterized by containing 0.2–5 wt % of a adhesive resin with a glass transition point (Tg) of 0° C. or below in terms of solid weight. Here, the adhesive resin may preferably be at least one selected from the group consisting of polyvinyl ether and polybutadiene. Furthermore, the conductive paste may contain a volatile solvent.

A fourth aspect of the present invention is to provide a conductive paste curing method characterized in that an ultraviolet irradiation lamp with infrared ray emission is used as a light source, and a conductive paste is irradiated with light from said light source for curing.

In the above method, the ultraviolet irradiation lamp may preferably be any one selected from among a metal halide lamp, a high-pressure mercury lamp, and a xenon lamp.

In addition, a fifth aspect of the present invention is to provide a method of forming an antenna for a radio frequency identification medium provided with an IC chip and the antenna, said method comprising the steps of: printing a thermosetting conductive paste in a pattern with a shape of the antenna on a surface of a substrate on which the IC chip is mounted; and irradiating the printed surface of the thermosetting conductive paste with infrared rays to cure the thermosetting conductive paste. Here, the infrared rays irradiated onto said printed surface may preferably be near-infrared rays.

A sixth aspect of the present invention is to provide a method of forming an antenna for a radio frequency identification medium provided with an IC chip and the antenna, the method comprising the steps of: printing any one of the above-mentioned conductive paste in an antenna-shaped pattern on a substrate on which the IC chip is mounted; and curing the conductive paste.

A seventh aspect of the present invention is to provide a method of forming an antenna for a radio frequency identification medium provided with an IC chip and the antenna, the antenna being an antenna comprising a coiled main antenna member and a crossing wire section situated across the main antenna member in connection with one end of the main antenna member, the method comprising the steps of: forming said main antenna member by printing with any one of the above-mentioned conductive paste on a substrate for mounting an IC chip; curing the conductive paste; printing an insulating material comprising an epoxy-based ultraviolet curing resin and insulating inorganic fine particles onto prescribed sites for the crossing wire section; curing the insulating material by ultraviolet irradiation; forming the crossing wire section onto the cured insulating material in connection with one end of the main antenna member by printing with any one of the above-mentioned conductive paste; and curing the conductive paste.

An eighth aspect of the present invention is to provide a method of forming a multi-layered circuit for a radio frequency identification medium provided with an IC chip and an antenna, the method comprising a step of alternately laminating a circuit and an insulating layer on a substrate to form the multi-layered circuit.

Here, either or both of the circuit and insulating layer may preferably be formed by printing with a photosetting paste. Furthermore, the multi-layered circuit may preferably have a function of an antenna.

A ninth aspect of the present invention is to provide a radio frequency identification medium characterized by having an IC chip mounted on a multi-layered circuit formed using the above-mentioned multi-layered circuit forming method.

A tenth aspect of the present invention is to provide a method of forming an antenna for a radio frequency identification medium provided with an IC chip and the antenna, the method comprising the steps of: providing a pair of antenna loops formed by printing with any one of the above-mentioned conductive paste on one side of a sheet-like substrate, as a symmetrical pattern positioned symmetrically around a folding section formed on the substrate as the center line; applying glue to at least one of the antenna loop-formed sides; and folding the substrate at the folding section so that the antenna loops are on the inside to attach and join the matching antenna loops.

Furthermore, an eleventh aspect of the present invention is to provide an IC chip mounting method for mounting an IC chip onto a circuit on a substrate, the method comprising the steps of: forming a circuit on the substrate on which the IC chip is to be situated, by printing with any one of the above-mentioned conductive paste; curing the conductive paste; forming connecting sections with terminals of the IC chip on the substrate by printing with a conductive adhesive substance; forming insulating sections in the mounting position of the IC chip on the substrate by printing with an insulating adhesive substance; placing the IC chip at the mounting position; and thermo-compression bonding from above the IC chip for mounting.

These and other objects and advantages of the present invention will become clear from the following description with reference to the accompanying drawings.

BRIEF DESCRIPTION OF THE DRAWINGS

FIGS. 5(A), 5(B), 5(C), 5(D), 5(E) and 5(F) are illustrations of a process for formation of an antenna according to the present invention.

FIGS. 11(A), 11(B), 11(C), 11(D) and 11(E) are illustrations of an example of mounting an IC chip according to the present invention.

FIGS. 12(a), 12(B), 12(C), 12(D) and 12(E) are illustrations of the mounting steps as viewed through a cross-section of the IC chip mounting position by the method according to the present invention.

DETAILED DESCRIPTION OF THE PREFERRED EMBODIMENTS

Figure 1:
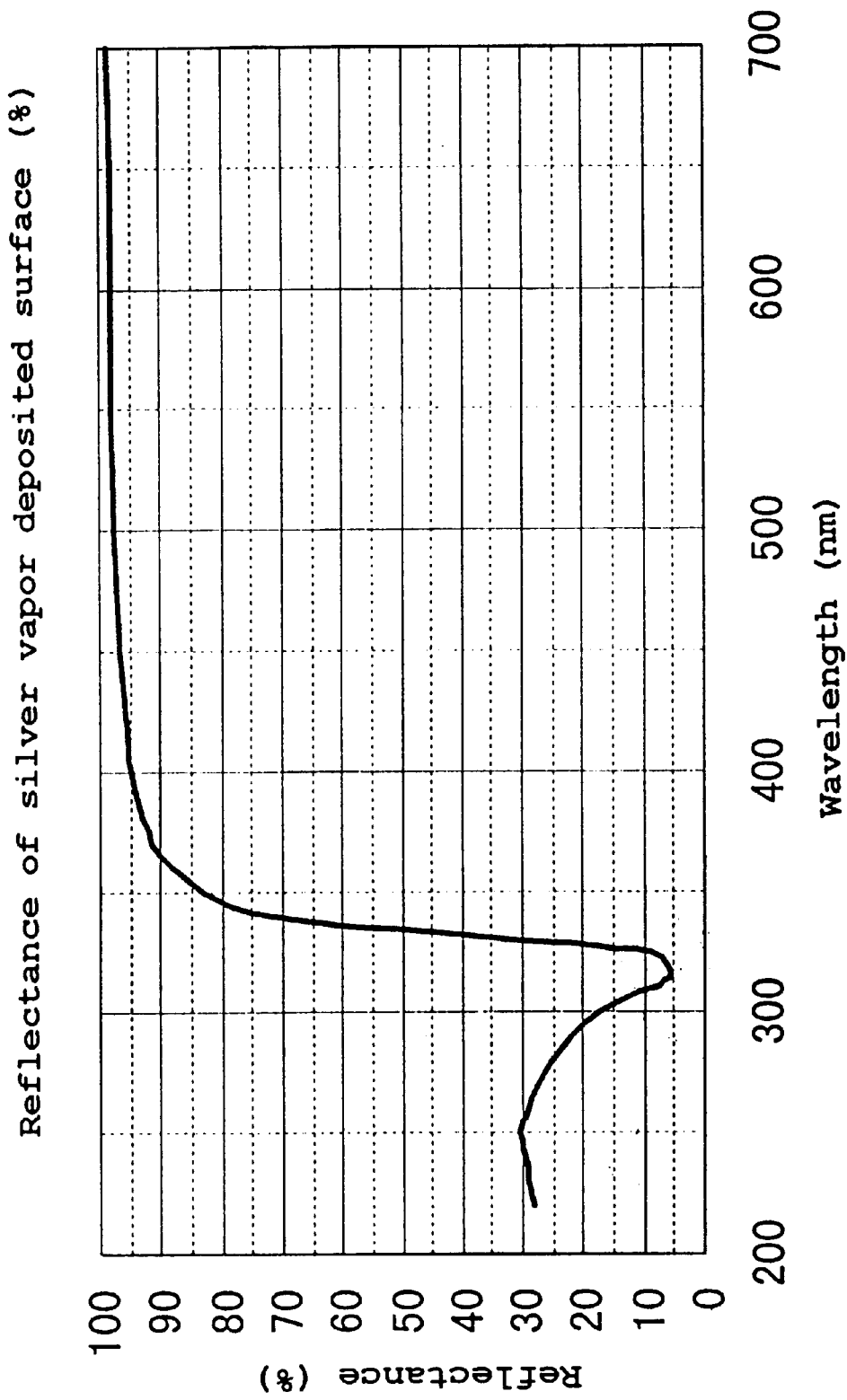
FIG. 1 is a graph showing reflectance of a silver vapor deposition surface at different wavelengths.

<<Conductive paste>>
First embodiment

The first embodiment of conductive paste according to the invention is a photosetting conductive paste comprising conductive powder (A1) and a photosetting resin composition (B1) as essential components.

The conductive powder (A1) is most preferably silver powder. Also, for control of the resistance value and solder consumption, a conductive powder of metal other than silver, such as gold, platinum, palladium, rhodium or the like may be added.

The conductive powder (A1) used may also be a mixture of two or more different powders with different properties including mean particle size, specific surface area and tap density, in order to satisfactorily control the printing property. Preferably (1) a dendritic conductive powder (A1-1) and (2) a scaly (or flaky) conductive powder (A1-2) are used as its essential components. According to the present invention, the dendritic conductive powder (A1-1) has a dendritic shape (also referred to as indeterminate forms), a mean particle size of 0.05–1.0 $\mu$m, a specific surface area of 0.5–5.0 $m^2/g$ and a tap density of 0.3–1.0 $g/cm^3$, and (2) the scaly conductive powder (A1-2) has a scaly or flaky shape, a mean particle size of 1.0–10.0 $\mu$m, a specific surface area of 0.5–5.0 $m^2/g$ and a tap density of 1.0–5.0 $g/cm^3$. The conductive powder used is preferably a combination of the dendritic conductive powder (A1-1) and the scaly or flaky conductive powder (A1-2) in a weight ratio of 60/40–95/5, constituting at least 80% of the total conductive powder.

In order to improve compatibility with the organic composition in the paste containing the conductive powder (A1) and to improve the dispersability of the conductive powder in the paste, the conductive powder is preferably subjected to surface treatment either during the production steps or after production of the conductive powder. The surface treatment agent used may be a surfactant or another organic compound.

The photosetting resin composition (B1) comprises, as essential components, (1) a photosetting initiator (B1-1) that generates free radical active species or cationic active species upon light irradiation, and (2) a photoreactive resin (B1-2) with a functional group that reacts with these active species, in combination at a weight ratio of 0.01/100–10/100.

The photosetting initiator (B1-1) used may be a publicly known one; preferred initiators that generate free radical active species are benzophenone derivatives, thioxanthone derivatives, anthraquinone derivatives, trichloromethyltriazine derivatives, acylphosphine oxide derivatives, $\alpha$-hydroxyketone derivatives, $\alpha$-aminoketone derivatives, benzoin derivatives, benzylketal derivatives, acridine derivatives, carbazol/phenone derivatives, and combinations thereof, and preferred initiators that generate cationic-active species are aromatic sulfonium salt compounds, aromatic iodonium salt compounds and combinations thereof.

The photoreactive resin (B1-2) used may be a publicly known one; preferred resins that react with free radical species are acrylate compounds and methacrylate compounds, and preferred resins that react with cationic active species are alicyclic epoxy compounds, oxetane compounds, alkene oxide compounds, glycidyl ether compounds and vinyl ether compounds. In either case, any two or more compounds may also be used in combination.

The viscosity of the total photoreactive resin (B1-2) is preferably 1–5000 mPa·s (cpoise) at 25° C. in order to guarantee kneading with the conductive powder and the printing properties of the paste, but 10–2000 mPa·s (cpoise) is more preferred.

For control of the reactivity it is preferred to add a photosensitizing agent, for example a phenothiazine derivative, a xanthone derivative, a thioxanthone derivative, an aminobenzoic acid derivative, a polycyclic aromatic compound such as anthracene, phenanthrene or perylene, or a combination thereof, or a reaction aid such as a hydroxy compound, amino compound or the like. Here, it is preferably added at 0.01–100% with respect to the weight of the photosetting initiator (B1-1).

The weight ratio of the conductive powder (A1) and the photosetting resin composition (B1) is preferably 50/50–95/5, and more preferably 55/45–90/10.

So long as the photosetting properties of the photosetting conductive paste according to the first embodiment of the invention are not impaired, there may be added publicly known components such as silica, alumina, mica, carbon powder, pigments, dyes, polymerization terminators, thickeners, thixotropic agents, suspending agents, antioxidants, dispersants, resins, organic solvents and the like. These are preferably added in a total amount of no more than 35% with respect to the total weight of the conductive powder (A1) and the photosetting resin composition (B1).

The resin (hereunder referred to as the resin (C)) that can be added to the photosetting conductive paste according to the first embodiment of the invention may be a publicly known one. As examples there may be mentioned thermosetting resins such as phenol resins, epoxy resins, melamine resins, urea resins, xylene resins, alkyd resins, unsaturated polyester resins, acrylic resins, furan resins, urethane resins, etc.; and thermoplastic resins such as polyethylene, polypropylene, polystyrene, ABS resins, polymethyl methacrylate, polyvinyl chloride, polyvinylidene chloride, polyvinyl acetate, polyvinyl alcohol, polyacetal, polycarbonate, polyethylene terephthalate, polybutylene terephthalate, polyphenylene oxide, polysulfone, polyimide, polyether sulfone, polyallylate, polyether ether ketone, polyethylene tetrafluoride, silicone resins, etc. These may be used alone or in combinations of two or more.

The solvent (hereunder referred to as the solvent (D)) that can be added to the photosetting conductive paste according to the first embodiment of the invention may be a publicly known one. However, in order to avoid residue in the system after the curing reaction, it preferably has a boiling point of no higher than 250° C. Examples include hydrocarbon solvents such as toluene, cyclohexane, methylcyclohexane, n-hexane and pentane; alcohols such as isopropyl alcohol and butyl alcohol; ketones such as cyclohexanone, methyl ethyl ketone, methyl isobutyl ketone, diethyl ketone and isophorone; esters such as ethyl acetate, propyl acetate and butyl acetate; glycol monoethers and their acetates, such as ethyleneglycol monomethyl ether, propyleneglycol monoethyl ether, diethyleneglycol monomethyl ether and 3-methoxy-3-methylbutyl acetate; as well as mixed solvents comprising two or more of these.

Preparation of the photosetting conductive paste according to the first embodiment of the invention includes, but is not limited to, a method whereby the aforementioned mixture is uniformly agitated with a homogenizer or other type of stirrer, and then evenly dispersed with a kneading machine such as a triple roll or a kneader.

The viscosity of the photosetting conductive paste according to the first embodiment of the invention is preferably from 1000 to 1,000,000 mPa·s (cpoise) in order to provide appropriate processability of printing and enough thickness after printing. It is more preferably from 10,000 to 500,000 mPa·s.

When the photosetting conductive paste according to the first embodiment of the invention is used to form a pattern by screen printing, offset printing or a publicly known method using a coater the substrate (hereunder referred to as the substrate (E)) used is a publicly known one such as ceramic or glass; a woven or nonwoven fabric of inorganic fibers or organic fibers; paper; a composite material comprising these with a thermosetting resin or thermoplastic resin; plastics including polyolefins such as polyethylene and polypropylene; polyesters such as polyethylene terephthalate, polybutylene terephthalate, polyethylene naphthalate and polyallylate; and polyimides, polyamides, polyether amides, polyimide amides, polyacetals, polyether sulfone, polyether ether ketone, polysulfone, acrylonitrile-butadiene-styrene copolymer, polyvinyl chloride, silicone rubber, natural rubber, synthetic rubber, etc. For improved processability of printing and fixability on the surface of these substrates, it may be subjected to chemical treatment such as coupling agent treatment or primer treatment, or to physical treatment such as corona discharge treatment, plasma treatment, ultraviolet treatment or polishing treatment.

To obtain a sheet when the photosetting conductive paste according to the first embodiment of the invention is used to form a pattern as a conductive layer on the substrate, it is usually applied by a screen printing method. The printing thickness can be optionally controlled as desired by changing the material of the screen (polyester, polyamide or stainless steel), the mesh and tension, and the viscosity of the paste. A preferred printing thickness is 5–100 µm, and a more preferred printing thickness is 10–80 µm.

The light source for curing of the photosetting conductive paste according to the first embodiment of the invention may be a publicly known one such as a high-pressure mercury lamp, superhigh-pressure mercury lamp, electrodeless discharge lamp, excimer lamp, metal halide lamp, xenon lamp, a laser, semiconductor laser, or the like. High-pressure mercury lamps and metal halide lamps are especially preferred because of their relatively high energy intensity distribution in a wavelength range of 300–500 nm.

The intensity of the light source lamp is preferably at least 40 W/cm, and more preferably at least 80 W/cm. The cumulative dose required for photosetting is preferably 100–50,000 mJ/cm$^2$, and more preferably 500–10,000 mJ/cm$^2$ in a wavelength range of 300–500 nm. For removal of the volatile components during irradiation it is preferred to juxtapose air release and elimination facilities.

For further improved properties after curing, the substrate may also be subjected to heat treatment by oven heating, hot air blowing, infrared rays or microwave irradiation before the light irradiation, after the light irradiation or simultaneously with the light irradiation, so long as it does not cause any notable deterioration such as coloration, heat shrinkage, softening, brittleness or carbonization. To prevent deterioration of the substrate the heating temperature is preferably no higher than 150° C., and the heating time is preferably within 15 minutes.

Examples will now be provided to explain preparation of photosetting conductive pastes according to the first embodiment, and their pattern printing and photosetting. Preparation of photosetting conductive pastes

EXAMPLES 1–18

Preparation of Photosetting Resin Compositions

The compositions listed in Table 1 and Table 2 were mixed and stirred for at least 30 minutes at room temperature while blocked from light to obtain uniform mixtures as photosetting resin compositions to be included in photosetting conductive pastes for the invention.

TABLE 1

| | Example | | | | | | | | |
|---|---|---|---|---|---|---|---|---|---|
| | 1 | 2 | 3 | 4 | 5 | 6 | 7 | 8 | 9 |
| M-240 | 100 | 100 | — | — | 100 | 100 | 100 | 100 | 100 |
| M-360 | — | — | 100 | — | — | — | — | — | — |
| M-110 | — | — | — | 100 | — | — | — | — | — |
| BMS | 5 | — | 5 | 5 | — | — | — | — | — |
| 2-EAQ | — | 5 | — | — | — | — | — | — | — |
| Triazine B | — | — | — | — | 0.5 | — | — | — | — |
| Triazine PMS | — | — | — | — | — | 0.5 | — | — | — |
| KT046 | — | — | — | — | — | — | 1 | — | — |
| Lucirin TPO | — | — | — | — | — | — | — | 2 | — |
| I-819 | — | — | — | — | — | — | — | — | 2 |

TABLE 1-continued

| | Example | | | | | | | | |
|---|---|---|---|---|---|---|---|---|---|
| | 1 | 2 | 3 | 4 | 5 | 6 | 7 | 8 | 9 |
| DMBI (parts by weight) | 2 | 2 | 2 | 2 | — | — | — | — | — |

[Photoreactive resins]
M-240: Aronix M-240 (polyethylene glycol diacrylate), product of Toa Gosei, KK.
M-360: Aronix M-360 (trimethylolpropane ethylene oxide-modified triacrylate), product of Toa Gosei, KK.
M-110: Aronix M-110 (p-cumylphenol ethylene oxide-modified acrylate), product of Toa Gosei, KK. ps
[Photoinitiators (Photosetting initiators)]
BMS: Kayacure BMS ([4-methylphenylthio)phenyl] phenylmethanone), product of Nihon Kayaku, KK.,
2-EAQ: Kayacure 2-EAQ (ethyl anthraquinone), product of Nihon Kayaku, KK.,
Triazine A: TRIAZINE B (2,4-trichloromethyl-(4'-methoxynaphthyl)-6-triazine), product of PANCHIM SA,
Triazine PMS: TRIAZINE PMS (2,4-trichloromethyl-(4'-methoxystyryl)-6-triazine), product of PANCHIM SA,
KTO46: ESACURE KTO 46 (mixture of 2,4,6-trimethylbenzoyl diphenylphosphine oxide, oligo [2-hydroxy-2-methyl-1-[4-(1-methylvinyl)phenyl]propane] and methylbenzophenone derivative), product of Lamberti Co.,
Lucirin TPO: Lucirin TPO (2,4,6-trimethylbenzoyl diphenylphosphine oxide), product of BASF Co.,
I-819: Irgacure 819 (bis(2,4,6-trimethylbenzoyl) phenylphosphine oxide), product of Ciba Specialty Chemical Co.
[Photosensitizing agent]
DMBI: Kayacure DMBI (isoamyl p-dimethylaminobenzoate), product of Nihon Kayaku, KK.

TABLE 2

| | Example | | | | | | | | |
|---|---|---|---|---|---|---|---|---|---|
| | 10 | 11 | 12 | 13 | 14 | 15 | 16 | 17 | 18 |
| KS-800 | 100 | 100 | 100 | 100 | — | — | — | — | 85 |
| KS-871 | — | — | — | — | 100 | — | — | — | — |
| UVR-6105 | — | — | — | — | — | 100 | — | — | — |
| limonene dioxide | — | — | — | — | — | — | 100 | — | — |
| W-100 | — | — | — | — | — | — | — | 100 | — |
| XDO | — | — | — | — | — | — | — | — | 15 |
| SP-170 | — | — | — | — | — | 3 | 3 | 3 | 1 |
| CP-66 | — | — | — | — | — | 3 | 3 | 3 | 1 |
| 9-cyano-anthracene | — | 0.5 | — | — | — | — | — | — | — |
| phenanthrene | — | — | 0.5 | — | — | — | — | — | — |
| phenothiazine (parts by weight) | — | — | — | 0.5 | — | — | — | — | — |

[Photoreactive resins]
KS-800: Adekaoptomer KS-800 (mixture of epoxy resin and aromatic sulfonium salt compound), product of Asahi Denka Kogyo, KK.,
KS-871: Adekaoptomer KS-871 (mixture of epoxy resin and aromatic sulfonium salt compound), product of Asahi Denka Kogyo, KK.,
UVR-6105: CYRACURE UVR-6105 (3,4-epoxycyclohexylmethyl-3,4-epoxycyclohexyl carboxylate), product of Union Carbide Co.
Limonene dioxide: Limonene dioxide (1-methyl-4-(2-methyloxiranyl)-7-oxabicyclo[4,1,0]heptane), product of Elf Atochem Co.,
W-100: Rikaresin W-100 (1,6-hexanediol diglycidyl ether), product of Shinnihon Rika, KK.,
XDO: XDO (1,4-bis[3-ethyl-3-oxetanylmethoxy)methyl] benzene), product of Toa Gosei, KK.
[Photoinitiators (Photosetting initiators)]
SP-170: Adekaoptomer SP-170 (aromatic sulfonium salt compound), product of Asahi Denka Kogyo, KK.,
CP-66: Adekaoptone CP-66 (aromatic sulfonium salt compound), product of Asahi Denka Kogyo, KK.

EXAMPLES 19–50

Compositions A, B, C and D as conductive powder were obtained by mixing Silvest E-20 and Silvest TCG-7 silver powders, both by Tokuriki Honten, KK., at 80/20 (wt/wt), 90/10 (wt/wt), 85/15 (wt/wt) and 75/25 (wt/wt).

Composition E was obtained by mixing Silvest E-20 with Silvest TCG-1 silver powder by Tokuriki Honten, KK., at 75/25 (wt/wt).

The resin compositions obtained in Examples 1 to 18 were mixed with conductive powders and different solvents in the proportions (parts by weight) shown in Tables 3 and 4 using a stirrer, and then subjected to high-shear kneading with a kneader, to obtain photosetting conductive pastes.

These photosetting conductive pastes were used to make sheets by screen printing onto substrates in a 1 mm width×1 m length pattern with a screen plate having a 180 mesh and capable of printing in a thickness of 15 μm. The printing thickness of the printed layer was about 15 μm.

The paper used as the substrate was NFI-55 by Nippon Seishi, KK. The polyethylene terephthalate film used was Lumira S, by Toray, KK.

The curing reaction was carried out by irradiation for 6 seconds in a conveyor-type irradiation apparatus, using as the light source a high-pressure mercury lamp with an output of 4 kw at 80 w/cm for Examples 19–31, and a metal halide lamp with an output of 4 kw at 80 w/cm for Examples 32–50. Under these conditions, the cumulative light amount in a wavelength range of 300–500 nm corresponds to about 2500 mJ/cm$^2$ for the high-pressure mercury lamp and about 5000 mJ/cm$^2$ for the metal halide lamp.

For the examples that employed solvents, the pattern-printed substrate was irradiated with light after being allowed to stand for 5 minutes in a draft oven at 100° C.

No notable deterioration such as coloration, heat shrinkage, softening, brittleness or carbonization was found in any of the substrates used.

The surface resistance was determined by applying a DC voltage and measuring the resistance between the two ends of the pattern after curing (the surface resistance hereinafter were measured in the same manner as above). The results are shown in Tables 3 and 4.

TABLE 3

| | Example | | | | | | | | | | | | |
|---|---|---|---|---|---|---|---|---|---|---|---|---|---|
| | 19 | 20 | 21 | 22 | 23 | 24 | 25 | 26 | 27 | 28 | 29 | 30 | 31 |
| Photosetting resin composition | | | | | | | | | | | | | |
| Example 1 | 35 | 20 | 35 | — | — | — | — | — | — | — | — | — | — |
| Example 2 | — | — | — | 40 | — | — | — | — | — | — | — | — | — |
| Example 3 | — | — | — | — | 40 | — | — | — | — | — | — | — | — |
| Example 4 | — | — | — | — | — | 40 | 20 | — | — | — | — | — | — |
| Example 5 | — | — | — | — | — | — | — | 45 | — | — | — | — | — |
| Example 6 | — | — | — | — | — | — | — | — | 45 | — | — | — | — |
| Example 7 | — | — | — | — | — | — | — | — | — | 45 | 20 | — | — |
| Example 8 | — | — | — | — | — | — | — | — | — | — | — | 45 | — |
| Example 9 | — | — | — | — | — | — | — | — | — | — | — | — | 45 |
| Conductive powder | | | | | | | | | | | | | |
| Composition A | 65 | 70 | — | — | — | — | 70 | — | — | — | 70 | — | — |
| Composition B | — | — | 65 | 60 | 60 | 60 | — | 55 | 55 | 55 | — | 55 | 55 |
| Solvent | | | | | | | | | | | | | |
| Isophorone | — | — | — | — | — | — | — | — | — | — | — | — | — |
| carbitol acetate | — | 2 | — | — | — | — | 2 | — | — | — | 2 | — | — |
| butyl cellosolve | — | 3 | — | — | — | — | 3 | — | — | — | 3 | — | — |
| cellosolve acetate | — | 5 | — | — | — | — | 5 | — | — | — | 5 | — | — |
| Surface resistance | | | | | | | | | | | | | |
| paper substrte mΩ/sq. | 150 | 112 | 127 | 100 | 186 | 167 | 95 | 156 | 119 | 110 | 75 | 137 | 123 |
| PET substrate mΩ/sq. | 180 | 133 | — | — | — | 191 | 132 | — | — | — | 190 | — | — |

Remarks:
The light source used was an 80 W/cm high-pressure mercury lamp (with ozone).

TABLE 4

| | Example | | | | | | | | | | | | | | | | | | |
|---|---|---|---|---|---|---|---|---|---|---|---|---|---|---|---|---|---|---|---|
| | 32 | 33 | 34 | 35 | 36 | 37 | 38 | 39 | 40 | 41 | 42 | 43 | 44 | 45 | 46 | 47 | 48 | 49 | 50 |
| Photosetting resin composition | | | | | | | | | | | | | | | | | | | |
| Example 10 | 40 | 40 | 40 | 40 | 40 | 20 | 20 | 25 | — | — | — | — | — | — | — | — | — | — | — |
| Example 11 | — | — | — | — | — | — | — | — | 45 | — | — | — | — | — | — | — | — | — | — |
| Example 12 | — | — | — | — | — | — | — | — | — | 45 | — | — | — | — | — | — | — | — | — |
| Example 13 | — | — | — | — | — | — | — | — | — | — | 45 | — | — | — | — | — | — | — | — |
| Example 14 | — | — | — | — | — | — | — | — | — | — | — | 45 | — | — | — | — | — | — | — |
| Example 15 | — | — | — | — | — | — | — | — | — | — | — | — | 40 | — | — | — | — | — | — |
| Example 16 | — | — | — | — | — | — | — | — | — | — | — | — | — | 35 | 40 | 20 | 20 | — | — |
| Example 17 | — | — | — | — | — | — | — | — | — | — | — | — | — | — | — | — | — | 40 | — |
| Example 18 | — | — | — | — | — | — | — | — | — | — | — | — | — | — | — | — | — | — | 40 |
| Conductive powder | | | | | | | | | | | | | | | | | | | |
| Composition A | 60 | — | — | — | — | 70 | 70 | 70 | — | — | — | — | — | 65 | 60 | 70 | 70 | 60 | 60 |
| Composition B | — | 60 | — | — | — | — | — | — | — | — | — | — | — | — | — | — | — | — | — |
| Composition C | — | — | 60 | — | — | — | — | — | — | — | — | — | — | — | — | — | — | — | — |
| Composition D | — | — | — | 60 | — | — | — | — | — | — | — | — | — | — | — | — | — | — | — |
| Composition E | — | — | — | — | 60 | — | — | — | 55 | 55 | 55 | 55 | 60 | — | — | — | — | — | — |
| Solvent | | | | | | | | | | | | | | | | | | | |
| Isophorone | — | — | — | — | — | — | 2 | — | — | — | — | — | — | — | — | — | 2 | — | — |
| carbitol acetate | — | — | — | — | — | 5 | — | — | — | — | — | — | — | — | — | 5 | — | — | — |

TABLE 4-continued

| | Example | | | | | | | | | | | | | | | | | | |
|---|---|---|---|---|---|---|---|---|---|---|---|---|---|---|---|---|---|---|---|
| | 32 | 33 | 34 | 35 | 36 | 37 | 38 | 39 | 40 | 41 | 42 | 43 | 44 | 45 | 46 | 47 | 48 | 49 | 50 |
| butyl cellosolve | — | — | — | — | — | — | 3 | 5 | — | — | — | — | — | — | — | — | 3 | — | — |
| cellosolve acetate | — | — | — | — | — | 5 | 5 | — | — | — | — | — | — | — | — | 5 | 5 | — | — |
| Surface resistance | | | | | | | | | | | | | | | | | | | |
| paper substrate mΩ/sq. | 73 | 105 | 81 | 103 | 86 | 55 | 49 | 40 | 81 | 80 | 129 | 80 | 57 | 46 | 55 | 32 | 29 | 57 | 57 |
| PET substrate mΩ/sq. | 130 | 190 | 165 | — | — | 95 | 90 | 101 | 168 | 152 | — | 125 | 131 | 103 | 107 | 95 | 90 | 183 | 143 |

Remarks:
The light source used was an 80 W/cm metal halide lamp (with ozone).

[Effect]

According to the invention there is no need for the sintering step which has been essential for conductive pastes subjected to photosetting by the prior art, and thus it becomes possible to form conductive patterns with a surface resistance of 200 mΩ/sq. or less primarily by photosetting alone. Furthermore, because light irradiation can shorten the process by the order of a few seconds to a few minutes, superior mass-productivity and lower cost is possible.

Second embodiment

The second embodiment of conductive paste according to the invention comprises at least one type of processability of printing/bending ability improver (F2) as an essential component. The second embodiment of conductive paste according to the invention is preferably a photosetting conductive paste comprising a conductive powder (A2), a photosetting resin composition (B2) and a processability of printing/bending ability improver (F2) as essential components.

For this photosetting conductive paste, the conductive powder (A2) and photoconductive resin composition (B2) used may be the same ones mentioned for the conductive powder (A1) and photosetting resin composition (B1) described above.

The processability of printing/bending ability improver (F2) may be an inorganic substance with a large specific surface area, small apparent specific gravity and mean particle size, or a polymer compound with a low glass transition point. Specifically there may be mentioned:

(i) Silica with a specific surface area of at least 100 m²/g, an apparent specific gravity of no greater than 50 g/l and a mean primary particle size of no greater than 30 nm (for example, AEROSIL 200CF, 300CF, products of Nihon Aerosil, KK.), (ii) Saturated polyester resins with a softening temperature of 100° C. or below and a number average molecular weight of 1000–50,000 (for example, Vylon 500, 130, product of Toyo Boseki, KK.), (iii) Polyvinyl ether resins with a glass transition point (Tg) of –30° C. or below (for example, Lutonal M40, A25, products of BASF Co.), (iv) Phenoxy resins (referring to oligomers or polymers derived from bisphenol compounds and epichlorhydrin) with a softening temperature of 100° C. or higher (for example, Epikote 1010, 4010P, products of Yuka Shell Epoxy, KK.).

These contribute to improved processability of printing and bending ability by pseudo-crosslinking due to cohesive power or a pennate structure in the case of (i), by increasing the total viscosity of the ink and lowering the Tg of the film in the case of (ii) and (iii), and by substantial polymerization due to terminal crosslinking in the case of (iv). These may be used alone or in combinations of different types.

The ratio of the weight of the conductive powder (A2) to the total weight of the photosetting resin composition (B2) and the processability of printing/bending ability improver (F2) is preferably 50/50–95/5, and more preferably 55/45–90/10. With this range, the weight ratio of the photosetting resin composition (B2) and the processability of printing/bending ability improver (F2) is preferably 1/1–99/1, and more preferably 3/1–80/1.

Also, so long as the curability of the conductive paste according to the second embodiment of the invention is not impaired, there may be added to the conductive paste any publicly known components such as silica, alumina, mica, carbon powder, pigments, dyes, polymerization terminators, thickeners, thixotropic agents, suspending agents, antioxidants, dispersants, resins, organic solvents and the like.

The resin that may be added to the conductive paste according to the second embodiment of the invention may be any publicly known one. As examples there may be mentioned those referred to for the resin (C).

The solvent that may be added to the conductive paste according to the second embodiment of the invention may also be any publicly known one. However, in order to avoid residue in the system after the curing reaction, it preferably has a boiling point of no higher than 250° C. As examples there may be mentioned those referred to for the resin (D).

The total of these additives is preferably no greater than 35% with respect to the total weight of the conductive powder (A2), the photosetting resin composition (B2) and the processability of printing/bending ability improver (F2)

The method of preparing the conductive paste according to the second embodiment of the invention is the same as described above. The viscosity of the conductive paste according to the second embodiment of the invention is preferably from 1000 to 1,000,000 mPa·s (cpoise) in order to provide appropriate processability of printing and enough thickness after printing. It is more preferably from 10,000 to 500,000 mpa·s.

When the conductive paste according to the second embodiment of the invention is used to form a pattern by screen printing, offset printing or a publicly known method using a coater, the substrate used may be any of the examples mentioned for the substrate (E) above.

The method of forming a pattern on the substrate using the conductive paste according to the second embodiment of the invention may in conformity with the example described above. The light source used to cure the photosetting conductive paste according to the second embodiment of the invention may also be one of those referred to above.

Examples will now be provided to explain preparation of conductive pastes according to the second embodiment, and their pattern printing and photosetting.

EXAMPLES 51–63

Photosetting resin compositions and processability of printing/bending ability improvers were first mixed in the ratios (parts by weight) listed in Table 5 and stirred for at least 30 minutes at room temperature while blocked from light to obtain uniform mixtures. When necessary, dissolution was carried out by heating. After restoring each mixture to room temperature, the photosetting initiator was added, the mixture was stirred to uniformity, silver powder was mixed therewith in a stirrer, and high-shear kneading was carried out with a kneader to obtain photosetting conductive pastes according to the invention.

These photosetting conductive pastes were used for screen printing onto substrates in a 1 mm width×1 m length pattern with a screen plate having a 180 mesh and capable of printing in a thickness of 15 $\mu$m. The thickness of the printed layer was about 15 $\mu$m.

The paper used as the substrate was NPI-55 by Nippon Seishi, KK. The polyethylene terephthalate film used was Lumira S, by Toray, KK.

The curing reaction was carried out by 5 times' irradiation with a conveyor-type irradiation apparatus at 7 m/min, using a 160 W/cm metal halide lamp under conditions of 1100 mW/cm$^2$ (measured by UVR-T35, product of Topcon, KK.).

No notable deterioration such as coloration, heat shrinkage, softening, brittleness or carbonization was found in any of the substrates used.

The surface resistance was determined by measuring the resistance between the two ends of the pattern after curing. The results are shown in Table 1.

The processability of printing was generally evaluated based on ink spread, plate dropouts, fine line pitch, reproducibility, etc., and designated as ⊚=very good, ○=good, Δ=problematic or ×=uncoatable.

The bending ability test was carried out using a 2-kg cylindrical weight with a cross-sectional area of about 20 cm$^2$ for measurement at 25° C., by a procedure involving: folding inward while adhered and applying a load for 30 seconds→removing the load and standing for 30 seconds→folding outward and applying a load for 30 seconds→removing the load and standing for 1 minute→measurement of the resistance value. The results were expressed by evaluating a resistance value change of +5% or less as ⊚, over +5% and +10% or less as ○, over +10% and +20% or less as Δ and over +20% or breakage as ×.

TABLE 5

|  | Example | | | | | | | | | | | | |
| --- | --- | --- | --- | --- | --- | --- | --- | --- | --- | --- | --- | --- |
|  | 51 | 52 | 53 | 54 | 55 | 56 | 57 | 58 | 59 | 60 | 61 | 62 | 63 |
| Silver powder | | | | | | | | | | | | | |
| E-20 | 52 | 56 | 52 | 52 | 52 | 52 | 52 | 52 | 52 | 52 | 52 | 52 | 52 |
| TCG-7 | 13 | 14 | 13 | 13 | 13 | 13 | 13 | 13 | 13 | 13 | 13 | 13 | 13 |
| Photoreactive resin | | | | | | | | | | | | | |
| limonene dioxide | 34 | 29 | 30 | 30 | 30 | — | — | — | — | 8.5 | 7.5 | — | — |
| UVR-6105 | — | — | — | — | — | 34 | 30 | — | — | — | — | — | — |
| KS-600 | — | — | — | — | — | — | 34 | 30 | — | — | — | — | — |
| BEO-60E | — | — | — | — | — | — | — | — | — | 25.5 | 22.5 | — | — |
| XDO | — | — | — | — | — | — | — | — | — | — | — | 34 | 30 |
| Photosetting initiator | | | | | | | | | | | | | |
| SP-170 | 0.35 | 0.30 | 0.35 | 0.35 | 0.35 | 0.35 | 0.35 | — | — | 0.35 | 0.35 | 0.35 | 0.35 |
| CP-66 | 0.35 | 0.30 | 0.35 | 0.35 | 0.35 | 0.35 | 0.35 | — | — | 0.35 | 0.35 | 0.35 | 0.35 |
| processability of printing/ bending ability improver | | | | | | | | | | | | | |
| Aerosil 200CF | 1 | 1 | — | — | — | 1 | — | 1 | — | 1 | — | 1 | — |
| Vylon 500 | — | — | 5 | — | — | — | 5 | — | 5 | — | 5 | — | 5 |
| Lutonal M40 | — | — | — | 5 | — | — | — | — | — | — | — | — | — |
| Epikote 4010P | — | — | — | — | 5 | — | — | — | — | — | — | — | — |
| processability of printing | ⊚ | ○ | ⊚ | ○ | ⊚ | ○ | ○ | ○ | ○ | ○ | ○ | ○ | ○ |
| Surface resistance | | | | | | | | | | | | | |
| Paper substrate | 48 | 49 | 49 | 56 | 43 | 48 | 50 | 52 | 51 | 47 | 31 | 79 | 78 |

TABLE 5-continued

| | Example | | | | | | | | | | | | |
|---|---|---|---|---|---|---|---|---|---|---|---|---|
| | 51 | 52 | 53 | 54 | 55 | 56 | 57 | 58 | 59 | 60 | 61 | 62 | 63 |
| (mΩ/sq.) PET substrate (mΩ/sq.) | 82 | 90 | 102 | 111 | 81 | 90 | 95 | 101 | 112 | 122 | 130 | 140 | 133 |
| Bending test | ⊚ | ⊚ | ⊚ | ○ | ⊚ | ⊚ | ○ | ⊚ | ○ | ○ | ○ | ○ | ○ |

[Silver powders]
E-20: Silvest E-20, product of Tokuriki Honten, KK.,
TCG-7: Silvest TCG-7, product of Tokuriki Honten, KK.
[Photoreactive resins]
KS-800: Adekaoptomer KS-800 (mixture of epoxy resin and aromatic sulfonium salt compound), product of Asahi Denka Kogyo, KK.,
UVR-6105: CYRACURE UVR-6105 (3,4-epoxycyclohexylmethyl-3,4-epoxycyclohexyl carboxylate), product of Union Carbide Co.
Limonene dioxide: Limonene dioxide (1-methyl-4-(2-methyloxiranyl)-7-oxabicyclo[4,1,0]heptane), product of Elf Atochem Co.,
BEO-60E: Rikaresin BEO-60E (ethylene oxide-modified bisphenol A epoxy), product of Shinnihon Rika, KK.,
XDO: XDO (1,4-bis[3-ethyl-3-oxetanylmethoxy)methyl] benzene), product of Toa Gosei, KK.
[Photosetting initiators]
SP-170: Adekaoptomer SP-170 (aromatic sulfonium salt compound), product of Asahi Denka Kogyo, KK.,
CP-66: Adekaoptone CP-66 (aromatic sulfonium salt compound), product of Asahi Denka Kogyo, KK.
[Processability of printing/bending ability improvers]
Aerosil 200CF: Silica Aerosil 200CF, product of Nihon Aerosil, KK.,
Vylon 500 (specific surface area: 200 m²/g, apparent specific gravity: 30 g/l, primary mean particle size: 12 nm): Polyester Vylon 500 (softening temperature: −20 to 10° C., number average molecular weight: 5000–25,000), product of Toyo Boseki, KK.,
Lutonal M40: Polyvinyl methyl ether Lutonal M40 (glass transition point: −49° C.), product of BASF Co.,
Epikote 4010P: Epoxy Epikote 4010P (softening temperature: 135° C.) product of Yuka Shell Epoxy, KK.

COMPARATIVE EXAMPLES 1–6

Photosetting conductive pastes were prepared in the same manner as Examples 51–63 with the compositions (parts by weight) listed in Table 6, and these were evaluated after printing and curing.

TABLE 6

| | Comparative Example | | | | | |
|---|---|---|---|---|---|---|
| | 1 | 2 | 3 | 4 | 5 | 6 |
| Silver powder | | | | | | |
| E-20 | 52 | 56 | 52 | 52 | 52 | 52 |
| TCG-7 | 13 | 14 | 13 | 13 | 13 | 13 |
| Photoreactive resin | | | | | | |
| limonene dioxide | 35 | 30 | — | — | 8.75 | — |

TABLE 6-continued

| | Comparative Example | | | | | |
|---|---|---|---|---|---|---|
| | 1 | 2 | 3 | 4 | 5 | 6 |
| UVR-6105 | — | — | 35 | — | — | — |
| KS-800 | — | — | — | 35 | — | — |
| BEO-60E | — | — | — | — | 26.25 | — |
| XDO | — | — | — | — | — | 35 |
| Photosetting initiator | | | | | | |
| SP-170 | 0.35 | 0.30 | 0.35 | — | 0.35 | 0.35 |
| CP-66 | 0.35 | 0.30 | 0.35 | — | 0.35 | 0.35 |
| processability of printing | Δ | Δ | ○ | ○ | Δ | Δ |
| Surface resistance | | | | | | |
| Paper substrate (mΩ/sq.) | 55 | 45 | 57 | 70 | 31 | 79 |
| PET substrate (mΩ/sq.) | 107 | 99 | 131 | 134 | 130 | 391 |
| Bending test | x | x | x | x | Δ | x |

A comparison of Table 5 and Table 6 shows that the pastes of Examples 51 to 63 were more satisfactory than those of Comparative Examples 1 to 6.

[Effect]

The photosetting conductive pastes according to the second embodiment of the invention have the merit of rapid curing by light irradiation, coupled with vastly improved processability of printing and bending resistance of the photosetting conductive pastes. They can also be applied to circuit formation at a narrow pitch of 0.20 μm or less and to plastic and paper substrates with a thickness of 50 μm or less, whereby such circuit formation and circuit formation onto plastic and paper substrates is thereby facilitated.

Third embodiment

The third embodiment of conductive paste according to the invention is a photosetting conductive paste comprising as essential components, a combination of silver powder, a photoreactive resin (B3-2) and a photosetting initiator (B3-1) or photosensitizing agent (B3-3) having a light absorption maximum in a wavelength range of 300–450 nm, within the wavelength region of 270 to 700 nm.

In this case, the silver powder may be a mixture of two or more different powders of different types including mean particle size, specific surface area and tap density, in order to satisfactorily control the printing property. In order to improve compatibility with the organic composition in the paste of the powder and to improve the dispersability of the powder in the paste, the conductive powder may be subjected to surface treatment either during the production steps of after production of the powder. The surface treatment agent used may be a publicly known one.

The photoreactive resin (B3-2) is a reactive resin that has a functional group reacting with the generated free radical active species or cationic active species, and there may be mentioned the same compounds mentioned as examples for the photoreactive resin (B1-2). A greater average number of reactive groups per molecule is better for rapid curing, but an excessive degree of polyfunctional properties results in considerable curing shrinkage that produces wrinkles in the coated film, and therefore an upper limit of an average of 4 per molecule is preferred. In any case, 2 or more different types of the photoreactive resins may be used in admixture.

The total viscosity of the photoreactive resin (B2-2) is preferably 1–5000 mPa·s (cpoise) at 25° C. in order to guarantee kneading with the silver powder and the printing properties of the paste, but 10–2000 mpa·s (cpoise) is more preferred.

According to this embodiment, a photosetting initiator (B3-1) or photosensitizing agent (B3-3) is used which has a light absorption maximum in a wavelength range of 300–450 nm, within the wavelength region of 270 to 700 nm. The reflectivity of silver is listed on page 511 of the Physics Table (1986 edition, Maruzen, KK.), where silver is shown as exhibiting a reflectivity of 20% or lower at 300–320 nm (see FIG. 1). Silver absorbs light in this wavelength range, causing an energy transfer that can excite other adjacent substances. Since the energy contributed is less than the energy that excited the silver itself, the excitation energy can be received by substances with light absorption not only at 300–320 nm but even toward the long wavelength end. Therefore, using an initiator or sensitizer meeting this condition can achieve photosetting that was considered disadvantageous because of reflection and blocking by metals. Apart from this absorption wavelength, however, the energy transfer rate is undesirably lower, and thus even toward the long wavelength end it is preferably no higher than 450 nm.

The photosetting initiator (B3-1) or photosensitizing agent (B3-3) used according to the third embodiment of the invention may be a publicly known one. As examples there may be mentioned the photosetting initiators, [4-(methylphenylthio)phenyl] phenylmethanone (for example, Kayacure BMS, trade name of Nihon Kayaku, KK., absorption maximum: 315 nm), ethyl anthraquinone (for example, Kayacure 2-EAQ, trade name of Nihon Kayaku, KK., absorption maximum: 325 nm), 2,4-diethylthioxanthone (for example, Kayacure DETX-S, trade name of Nihon Kayaku, KK., absorption maximum: 385 nm), 2-chlorothioxanthone (for example, Kayacure CTX, trade name of Nihon Kayaku, KK., absorption maximum: 385 nm), 2-benzyl-2-dimethylamino-1-(4-morpholinophenyl)-1-butanone (for example, Irgacure 369, trade name of Ciba Specialty Chemical Co., absorption maximum: 320 nm), 2,4-trichloromethyl (4'-methoxynaphthyl)-6-triazine (for example, TRIAZINE B, trade name of PANCHIM SA, absorption maximum: 380 nm), 2,4-trichloromethyl (4'-methoxystyryl)-6-triazine (for example, TRIAZINE PMS, trade name of PANCHIM SA, absorption maximum: 375 nm), etc., and the photosensitizing agents, isoamyl p-dimethylaminobenzoate (for example, Kayacure DMBI, trade name of Nihon Kayaku, KK., absorption maximum: 315 nm), perylene (absorption maximum: 430 nm), etc. Any of these may also be used in mixtures of two or more. The absorption maximum wavelength can be easily confirmed by ultraviolet/visible light absorption spectroscopy.

In order to control the reactivity, a reaction aid such as a hydroxy compound or amino compound may also be added. In that case, it is preferably added in an amount of 0.01–200% with respect to the weight of the photosetting initiator (B3-1) or photosensitizing agent (B3-3).

The weight ratio of the silver powder and the photoreactive resin (B3-2) is not particularly limited, but is preferably 10/90–95/5, and more preferably 30/70–90/10.

Also, so long as the effect of the invention is not impaired, there may be added publicly known components such as silica, alumina, mica, carbon powder, pigments, dyes, polymerization terminators, thickeners, thixotropic agents, suspending agents, antioxidants, dispersants, resins, organic solvents and the like. These are preferably added in a total amount of no more than 50% with respect to the total weight of the silver powder and the photoreactive resin (B3-2).

The resin that may be added to the conductive paste of the invention may be any publicly known one. As examples there may be mentioned those referred to for the resin (C).

The solvent that may be added to the conductive paste of the invention may also be any publicly known one. However, in order to avoid residue in the system after the curing reaction, it preferably has a boiling point of no higher than 250° C. As examples there may be mentioned those referred to for the resin (D).

The viscosity of the photosetting conductive paste according to the third embodiment of the invention is preferably from 10 to 1,000,000 mPa—s in order to provide appropriate processability of printing and enough thickness after printing. It is more preferably from 1000 to 300,000 mpa·s.

When the photosetting conductive paste according to the third embodiment of the invention is used to form a pattern by screen printing, offset printing or a publicly known method using a coater, the substrate used may be any of the examples mentioned for the substrate (E) above.

The light source used for curing of the photosetting conductive paste according to the third embodiment of the invention may be the same as referred to above.

Examples will now be provided to explain preparation of photosetting conductive pastes according to the third embodiment, and their printing and photosetting.

Preparation of photosetting conductive pastes (silver coatings)

EXAMPLES 64–75

Photosetting conductive pastes according to the invention were obtained by mixing the compositions (parts by weight) shown in Table 7 and stirring them with a kneader, and then homogenizing them with a triple roll. These photosetting conductive pastes were used to make sheets by screen printing onto substrates in a 1 mm width×1 m length pattern with a screen plate having a 180 mesh and capable of printing in a thickness of 15 μm. The thickness of the printed layer was about 15 μm.

The paper used as the substrate was NPI-55 by Nippon Seishi, KK. The polyethylene terephthalate (PET) film used was Lumira S, by Toray, KK.

The curing reaction was carried out by irradiation with a conveyor-type irradiation apparatus, using as the light source a high-pressure mercury lamp with an output of 4 kw at 80 w/cm and a metal halide lamp with an output of 4 kw at 80 w/cm.

Table 7 shows the light energy required for curing and the post-curing surface pencil hardness.

TABLE 7

| | Example | | | | | | | | | | | |
|---|---|---|---|---|---|---|---|---|---|---|---|---|
| | 64 | 65 | 66 | 67 | 68 | 69 | 70 | 71 | 72 | 73 | 74 | 75 |
| Resin | | | | | | | | | | | | |
| M-240 | 50 | 50 | — | — | 50 | 50 | 50 | 50 | 50 | — | — | 50 |
| M-360 | — | — | 40 | 40 | — | — | — | — | — | — | — | — |
| M-408 | — | — | 40 | 40 | — | — | — | — | — | — | — | — |
| KS-800 | — | — | — | — | — | — | — | — | — | 40 | — | — |
| UVR-6105 | — | — | — | — | — | — | — | — | — | — | 20 | — |
| limonene dioxide | — | — | — | — | — | — | — | — | — | — | 20 | — |
| Initiator | | | | | | | | | | | | |
| BMS | 2.5 | — | 2 | 2 | — | — | — | — | — | — | — | 2.5 |
| 2-EAQ | — | 2.5 | — | — | — | — | — | — | — | — | — | — |
| triazine B | — | — | — | — | 2.5 | — | — | — | — | — | — | — |
| triazine PMS | — | — | — | — | — | 2.5 | — | — | — | — | — | — |
| DETX-S | — | — | — | — | — | — | 1 | — | — | — | — | — |
| CTX | — | — | — | — | — | — | — | 1 | — | — | — | — |
| I-369 | — | — | — | — | — | — | — | — | 1 | — | — | — |
| SP-170 | — | — | — | — | — | — | — | — | — | — | 0.6 | — |
| CP-66 | — | — | — | — | — | — | — | — | — | — | 0.6 | — |
| Sensitizing agent | | | | | | | | | | | | |
| perylene | — | — | — | — | — | — | — | — | — | 0.2 | 0.2 | — |
| DMBI | 1 | 1 | 0.8 | 0.8 | — | — | 1 | 1 | — | — | — | 1 |
| Silver powder | | | | | | | | | | | | |
| E-20 | 37.5 | 37.5 | 45 | 45 | 37.5 | 37.5 | 37.5 | 37.5 | 37.5 | 45 | 45 | — |
| G-12 | — | — | — | — | — | — | — | — | — | — | — | 37.5 |
| TCG-1 | 12.5 | 12.5 | 15 | 15 | 12.5 | 12.5 | 12.5 | 12.5 | 12.5 | 15 | 15 | 12.5 |
| Light source | Hg | Hg | Hg | Hg | Hg | Hg | Hg | Hg | Hg | MH | MH | Hg |
| Curing energy | | | | | | | | | | | | |
| (mJ/cm$^2$) (Paper substrate) | 1000 | 1500 | 1500 | 500 | 1000 | 500 | 1000 | 1500 | 500 | 1000 | 500 | 250 |
| (mJ/cm$^2$) (PET substrate) | 1000 | 1500 | 500 | 500 | 500 | 1000 | 1000 | 1500 | 500 | 1000 | 500 | 250 |
| Pencil hardness (JIS K5400) | H | H | H | H | H | H | H | H | H | H | H | H |

[Photoreactive resins]
M-240: Aronix M-240 (polyethylene glycol diacrylate), product of Toa Gosei, KK.
M-360: Aronix M-360 (trimethylolpropane ethylene oxide-modified triacrylate), product of Toa Gosei, KK.
M-408: Aronix M-408 (ditrimethylolpropane tetraacrylate), product of Toa Gosei, KK.
KS-800: Adekaoptomer KS-800 (mixture of epoxy resin and aromatic sulfonium salt compound), product of Asahi Denka Kogyo, KK.,
UVR-6105: CYRACURE UVR-6105 (3,4-epoxycyclohexylmethyl-3,4-epoxycyclohexyl carboxylate), product of Union Carbide Co.
Limonene dioxide: Limonene dioxide (1-methyl-4-(2-methyloxiranyl)-7-oxabicyclo[4,1,0]heptane), product of Elf Atochem Co.
[Photoinitiators (Photosetting initiators)]
BMS: Kayacure BMS ([4-methylphenylthio)phenyl] phenylmethanone), product of Nihon Kayaku, KK.,
2-EAQ: Kayacure 2-EAQ (ethyl anthraquinone), product of Nihon Kayaku, KK.,
Triazine A: TRIAZINE B (2,4-trichloromethyl-(4'-methoxynaphthyl)-6-triazine), product of PANCHIM SA,
Triazine PMS: TRIAZINE PMS (2,4-trichloromethyl-(4'-methoxystyryl)-6-triazine), product of PANCHIM SA,
DETX-S: Kayacure DETX-S (2,4-diethylthioxanthone), product of Nihon Kayaku, KK.,
CTX: Kayacure CTX (2-chlorothioxanthone), product of Nihon Kayaku, KK.,
I-369: Irgacure 369 (2-benzyl-2-dimethylamino-1-(4-morpholinophenyl)-1-butanone), product of Ciba Specialty Chemical Co.,
SP-170: Adekaoptomer SP-170 (aromatic sulfonium salt compound), product of Asahi Denka Kogyo, KK.,
CP-66: Adekaoptone CP-66 (aromatic sulfonium salt compound), product of Asahi Denka Kogyo, KK.
[Photosensitizing agent]
DMBI: Kayacure DMBI (isoamyl p-dimethylaminobenzoate), product of Nihon Kayaku, KK.
[Silver powders]
E-20: Silvest E-20, product of Tokuriki Honten, KK.,
G-12: G-12, product of Dowa Kogyo, KK.,
TCG-1: Silvest TCG-1, product of Tokuriki Honten, KK.
[Light sources]
Hg: High-pressure mercury lamp with 4 kw output at 80 w/cm
MH: Metal halide lamp with 4 kw output at 80 w/cm
[Curing energy]
Measured using a UV POWER PUCK by EIT Instrumentation Equipment Co., U.S., at the light irradiation energy required for the coated film to become tack-free and fixed onto the substrate in a wavelength range of 320–390 nm.

COMPARATIVE EXAMPLES 7–11

These were comparative examples employing photosetting initiators or photosensitizing agents with no absorption maximum in the wavelength range of 300–450 nm within the wavelength region of 270–700 nm.

The compositions listed in Table 8 (parts by weight) were mixed to obtain pastes in the same manner as Examples 64–75, and were used for screen printing onto the same type of substrate. The same apparatus of Examples 64–75 was used for the photosetting reaction.

Table 8 shows the light energy required for curing and the post-curing surface pencil hardness. None of these were tack-free, and measurement of the pencil hardness was not possible.

The absorption maximum for the benzophenone initiator used here was 255 nm.

TABLE 8

| | Comparative Example | | | | |
|---|---|---|---|---|---|
| | 7 | 8 | 9 | 10 | 11 |
| Resin | | | | | |
| M-240 | 50 | 50 | 40 | — | — |
| KS-800 | — | — | — | 50 | — |
| UVR-6105 | — | — | — | — | 40 |
| Initiator | | | | | |
| benzo-phenone | 2.5 | 2.5 | 2.5 | — | — |
| SP-170 | — | — | — | — | 0.6 |
| CP-66 | — | — | — | — | 0.6 |
| Silver powder | | | | | |
| E-20 | 37.5 | — | 45 | 37.5 | 45 |
| G-12 | — | 37.5 | — | — | — |
| TCG-1 | 12.5 | 12.5 | 15 | 12.5 | 15 |
| Light source | Hg | Hg | Hg | MH | MH |
| Curing energy | | | | | |
| (mJ/cm$^2$) (Paper substrate) | >5000 | >5000 | >5000 | >5000 | >5000 |
| (mJ/cm$^2$) (PET substrate) | >5000 | >5000 | >5000 | >5000 | >5000 |
| Pencil hardness (JIS K5400) | unmeasurable | unmeasurable | unmeasurable | unmeasurable | unmeasurable |

[Effect]

According to the present invention explained above, it is possible to cure coatings with silver as fillers by light irradiation alone, whereas thermosetting has been necessary by the prior art. The treatment times of several ten minites or longer at 100° C. or above required for thermosetting pastes can be shortened to the order of a few seconds to a few minutes by light irradiation.

Fourth embodiment

The conductive pastes described above are photosetting types, but other solvent-dried types (or solvent-evaporated types) may also be used as conductive pastes instead of those mentioned above, to obtain antennas for radio frequency identification medium. Specifically, the fourth embodiment of a conductive paste according to the invention is a conductive paste containing 0.2–5 wt % of an adhesive resin with a glass transition point (Tg) of 0° C. or below in terms of solid weight.

This conductive paste can be used to obtain conductive paste films that are resistant to bending while maintaining the advantages of short curing times and low resistance exhibited by solvent-evaporated types, for formation of antennas onto easily bendable substrates and substrates that are sometimes folded.

The solvent-dried conductive paste comprises 0.2–5 wt %, and preferably 1–2 wt %, of an adhesive resin which is at least one selected from among polyvinyl ether resins, polybutadiene resins, acrylic resins, epoxy resins and urethane resins and has a glass transition point (Tg) of 0° C. or below, added to a common conductive ink. This maintains a low resistance value and provides improved bending resistance performance. Preferred adhesive resins are polyvinyl ether resins and polybutadiene resins.

When added in a small amount, the adhesive resin lowers the glass transition point (Tg) of the binder and inhibits its cracking. The adhesive resin component also has an effect of maintaining adhesion of the silver powder, even when added in a small amount. If too much of the adhesive resin component is added (10 wt % or more), the resistance value itself will be increased. It is also impossible to achieve a low resistance value if only the adhesive resin is used as the binder component of the conductive ink.

The evaluation test employed LS415CM by Asahi Chemical Laboratories, KK., TS5202 by Tanaka Kikinzoku, KK., and DW351 by Toyo Boseki, KK. as conductive inks, adding polyvinyl ether and polybutadiene at from 1 to 2 wt % in terms of solid weight, or without their addition, and measuring the film strength (bending resistance test) and surface resistance after curing. The results are shown in Table 9. In the table, A100 represents polyvinyl ethyl ether and M40 represents polyvinyl methyl ether, and the percentage values indicate the wt % of addition in terms of solid weight.

For the bending resistance test, an approximately 1-kg metal cylinder was rolled back and forth once on the inwardly folded conductive paste film after which the metal cylinder was rolled back and forth once after outward folding; this cycle was counted as one time, and the bending resistance was thereby confirmed.

TABLE 9

| | | Surface resistance (mΩ · cm$^{-1}$) (150° C. 30 min.) | Bending resistance test | Reaction completion time (min.) (150° C.) |
|---|---|---|---|---|
| Asahi Chemical Laboratories LS415CM | not added | 20 | 1 | 25 |
| | A100 (1%) | 26 | 5 or more | 25 |
| | M40 (1%) | 25 | 5 or more | 25 |
| | M40 (2%) | 28 | 5 or more | 25 |
| | Polybutadiene (1%) | 28 | 5 or more | 25 |
| Tanaka Kikinzoku TS5202 | not added | 18 | 1 | 20 |
| | A100 (1%) | 24 | 5 or more | 20 |
| Toyo Boseki DW351 | not added | 30 | 1 | 20 |
| | A100 (1%) | 36 | 5 or more | 20 |
| | M40 (1%) | 35 | 5 or more | 20 |
| | M40 (2%) | 39 | 5 or more | 20 |

As seen in Table 9, addition of polyvinyl ether and polybutadiene at from 1 to 2 wt % in terms of solid weight was shown to provide vast improvement in the film strength. When polyvinyl ether was added to a thermosetting conductive ink, the film strength increased, but the resistance value increased was greater.

[Effect]

With the aforementioned conductive paste, simple addition of an adhesive resin at 0.2–5 wt % in terms of solid weight allows improvement in the lower film strength that has been a drawback of solvent-dried conductive inks, while maintaining the low resistance and short curing times characteristic of solvent-dried conductive inks.

<<Conductive paste curing method>>

The present inventors focused on the fact that more infrared rays are irradiated by ultraviolet irradiation lamps used for curing of ultraviolet curing resins than by infrared irradiation lamps, and that the energy absorption by conductive pastes reaches to the ultraviolet ray area. The present invention therefore proposes a conductive paste curing method characterized in that the light source is an ultraviolet irradiation lamp with infrared ray emission to cure the conductive paste by irradiating with light from this light source.

The ultraviolet irradiation lamp used as the light source may be a high-pressure mercury lamp or a metal halide lamp. Because these use a mercury vapor discharge tube for the ultraviolet rays, the light energy emitted from the discharge tube is composed of 14.6% of ultraviolet rays, 11.3% of visible light rays, 45.5% of infrared rays and 28.7% of heat or the like. Excluding the ultraviolet ray portion and visible light ray portion, 74% of the input energy of the light source is converted to heat. The same is true of xenon lamps which are also ultraviolet irradiation lamps.

For comparison, halogen near-infrared irradiation lamps that irradiate near-infrared rays utilize filaments for light irradiation. Consequently, high output lamps have a maximum input of 1 to 2 KW, which is an input of 70 W/cm in terms of unit length, and corresponds to an infrared irradiation efficiency of 86%.

On the other hand, the maximum class of ultraviolet irradiation lamps are 280 W/cm, and the infrared irradiation efficiency thereof is about 45% as mentioned above. However, considered from the standpoint of input per unit length, the infrared ray irradiation is about twice that of the aforementioned halogen near-infrared lamps. From this standpoint, therefore, the conductive paste can be efficiently dried and cured by providing heat.

Figure 2:
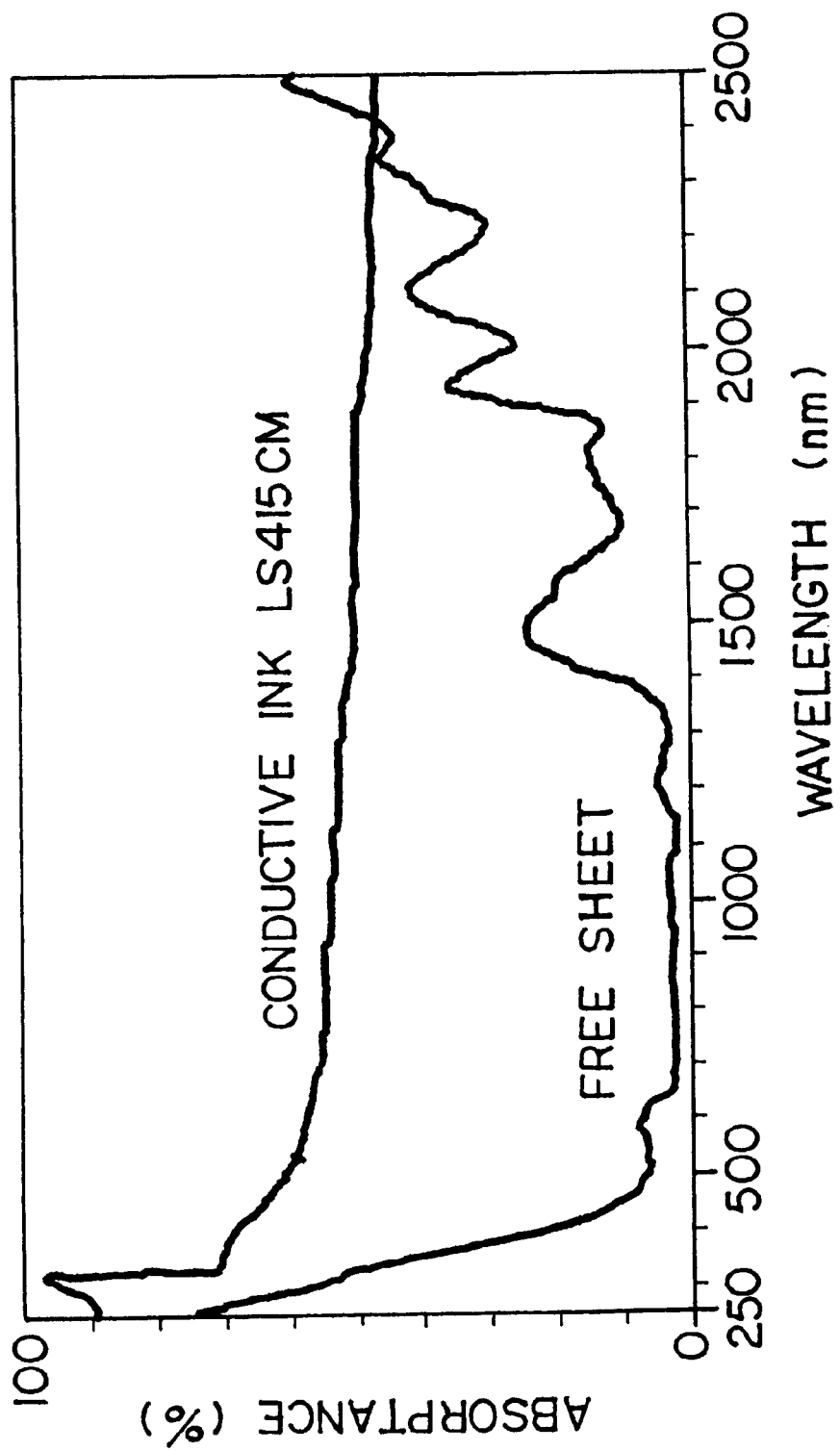
FIG. 2 is a graph showing absorptance of a conductive paste in different wavelength regions in comparison to a free sheet.

FIG. 2 shows the absorption of a conductive paste in different wavelength regions in comparison to a free sheet. As clearly shown here, the absorption of the conductive paste also reaches into the ultraviolet region. Thus, it becomes possible to utilize for heating virtually all of the light energy from the energy irradiated as light by an ultraviolet irradiation lamp (the portion minus the 28.7% heat).

For the measuring conditions, the free sheet used was an NPI55 by Nippon Seishi, the conductive paste used was LS-415-CM by Asahi Chemical Laboratories, KK., and an integrating sphere was mounted on a Hitachi U-3500 spectrophotometer for measurement of the reflection density.

Figure 3:
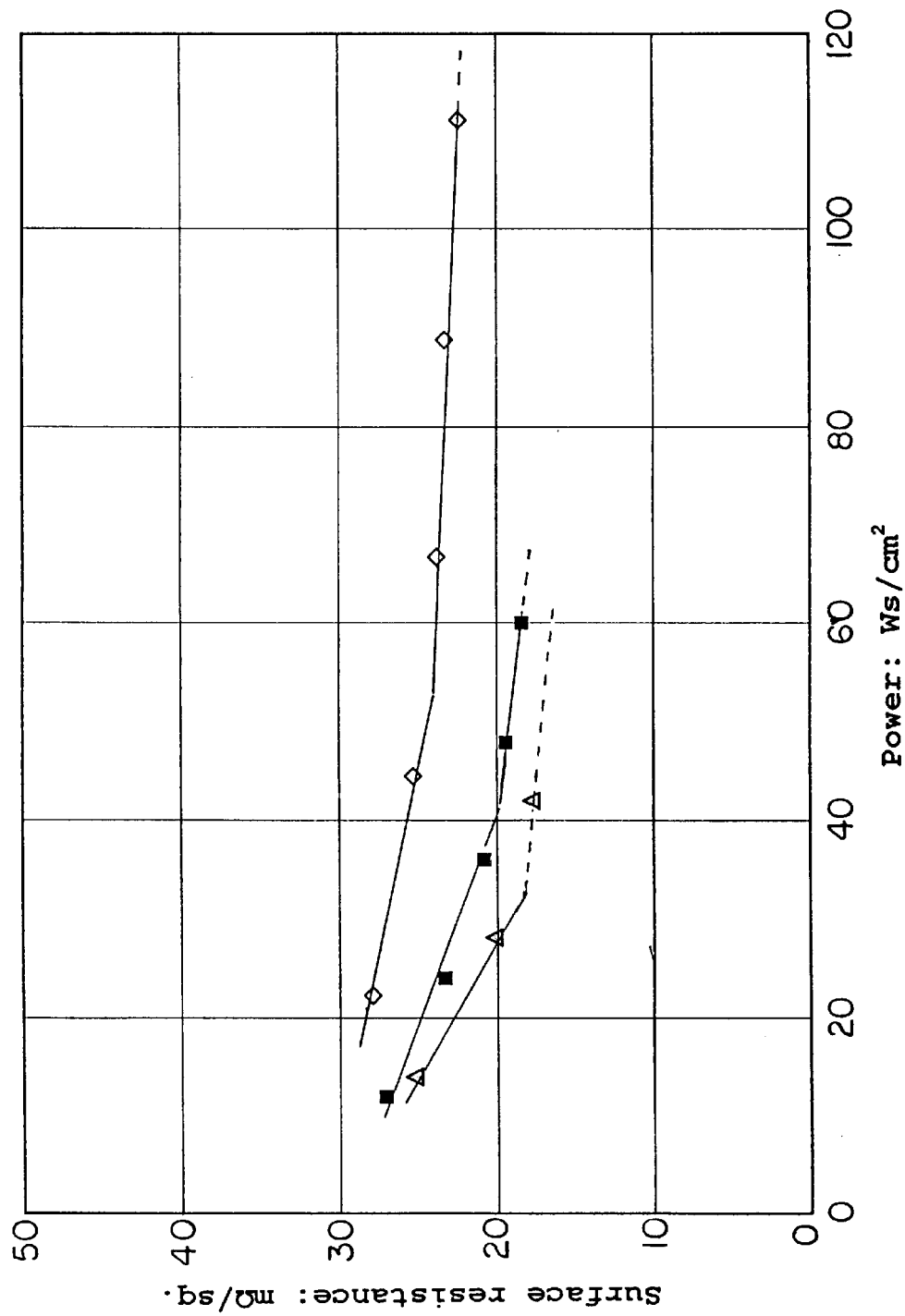
FIG. 3 is a graph showing surface resistance values with respect to power consumption per unit area of a cured conductive paste, for a case where an infrared irradiation lamp was used and a case where an ultraviolet irradiation lamp was used as the light source.

The surface resistance value of the conductive paste after curing was measured with an infrared irradiation lamp as the light source and with an ultraviolet irradiation lamp as the light source. FIG. 3 shows the change in surface resistance values with respect to power consumption per unit area. As is clear from FIG. 3, a comparison of the power consumption per unit area confirms that when a high-pressure mercury lamp is used for curing, it was possible to achieve efficient curing of the conductive paste with lower power consumption than when a near-infrared irradiation lamp is used. The symbols used in the graph are as follows.

◇: Using an infrared irradiation lamp (conditions: Conveyor-type 1 KW×3-bulb infrared irradiation apparatus by Eyegraphics, KK., lamp: QIR 200/200 V, 1000 W/G, 1000 W×3 bulbs, 4 cm irradiation distance, 5 m/min carrying speed)

■: Using an ultraviolet irradiation lamp (conditions: Toshiba UV irradiation apparatus by Toshiba Litech, KK., M8400L/A lamp, 240 W/cm output, 7 cm irradiation distance, 12 m/min carrying speed)

Δ: Using an ultraviolet irradiation lamp (conditions: Toshiba UV irradiation apparatus by Toshiba Litech, KK., M8400L/A lamp, 280 W/cm output, 7 cm irradiation distance, 12 m/min carrying speed)

[Effect]

It is possible to cure the conductive paste in a shorter time than those in case of curing by heat drying furnaces or infrared irradiation which are commonly employed in the prior art.

<<Method of forming antenna for radio frequency identification medium >>

First embodiment

The following explanation concerns a first embodiment of a method of forming an antenna for a radio frequency identification medium by which a conductive paste is used to form the antenna according to the invention.

According to this embodiment, a screen printing method, for example, is employed to print an antenna-shaped pattern of a thermosetting conductive paste on a prescribed location of a substrate on which an IC chip is mounted. After printing the thermosetting conductive paste on the substrate in the antenna shape, the printed side is exposed to infrared rays, preferably near-infrared rays, to cure the thermosetting conductive paste. An antenna is thus formed on the substrate by curing the thermosetting conductive paste.

An antenna-forming test was carried out by irradiation of infrared rays onto a thermosetting conductive paste. The evaluation standard, type of conductive paste and type of infrared light source were as follows.

(Evaluation standard)

When the conductive paste was cured under the conditions recommended by the manufacturer (150° C., 30 minutes) the surface resistance value was about 25 mΩ/sq. (a resistance value of 25 Ω for an antenna of 1 mm width and 1 m length), and therefore curing was considered complete when a resistance value of 25 mΩ/sq. was obtained by infrared irradiation.

(Type of conductive paste)

A 415CM by Asahi Chemical Laboratories, KK. and an FA333 by Fujikura Kasei were used. Roughly the same results were obtained with both.

(Type of light source)

Near-infrared irradiation lamp (QIR100V-1000W/D by Ushio Denki) Far-infrared irradiation lamp (QIR100V-1000YD by Ushio Denki) The distance from the light source to the conductive paste was 20 cm.

(Test results)

The results for the surface resistance values (units: mΩ/sq.) are shown below in Table 10.

TABLE 10

|  | Near-infrared irradiation lamp | Far-infrared irradiation lamp |
| --- | --- | --- |
| 5 secs exposure | 42 | — |
| 8 secs exposure | 33 | — |
| 10 secs exposure | 26 | — |
| 15 secs exposure | 18 | — |
| 20 secs exposure | 18 | 26 |

TABLE 10-continued

| | Near-infrared irradiation lamp | Far-infrared irradiation lamp |
|---|---|---|
| 30 secs exposure | 18 | 26 |
| 40 secs exposure | — | 22 |
| 60 secs exposure | — | — |
| 90 secs exposure | — | — |
| 120 secs exposure | — | — |

In the case of near-infrared irradiation with the near-infrared irradiation lamp, 25 mΩ/sq. was reached in 10–15 seconds.

In the case of far-infrared irradiation with the far-infrared irradiation lamp, 25 mΩ/sq. was reached in 30–40 seconds.

These results clearly show that irradiation with a near-infrared irradiation lamp and with a far-infrared irradiation lamp achieves target performance in a shorter time than by the conventional hot air blowing method. This may therefore be judged as an adequate effect considering that a curing time of at least about 20 minutes is required by the conventional method to obtain a resistance value of 35 mΩ/sq. when using hot air at 150° C.

A conductive paste expresses its performance by evaporation of the solvent and thermosetting of the resin which are contained therein. In other words, it is believed that the effect described above efficiently provides the conductive paste with a large volume of heat, and that this causes curing to proceed in a shorter time.

Incidentally, the temperature of the paper surface on the opposite side from the side where the conductive paste is applied reached 170° C. upon irradiation with the near-infrared irradiation lamp for 10 seconds. Thus, considering the "loss of heat until transfer to the opposite side" and the "temperature reduction due to the stand" (since the opposite side is in contact with a stand), the temperature of the conductive paste itself is believed to reach a considerably high temperature.

[Effect]

As explained above, employing infrared irradiation for curing of a conductive paste allows curing within a shorter time than by a conventional hot air curing system, and the shortened curing time for the conductive paste thus improves productivity for radio frequency identification mediums.

Second embodiment

Figure 4:
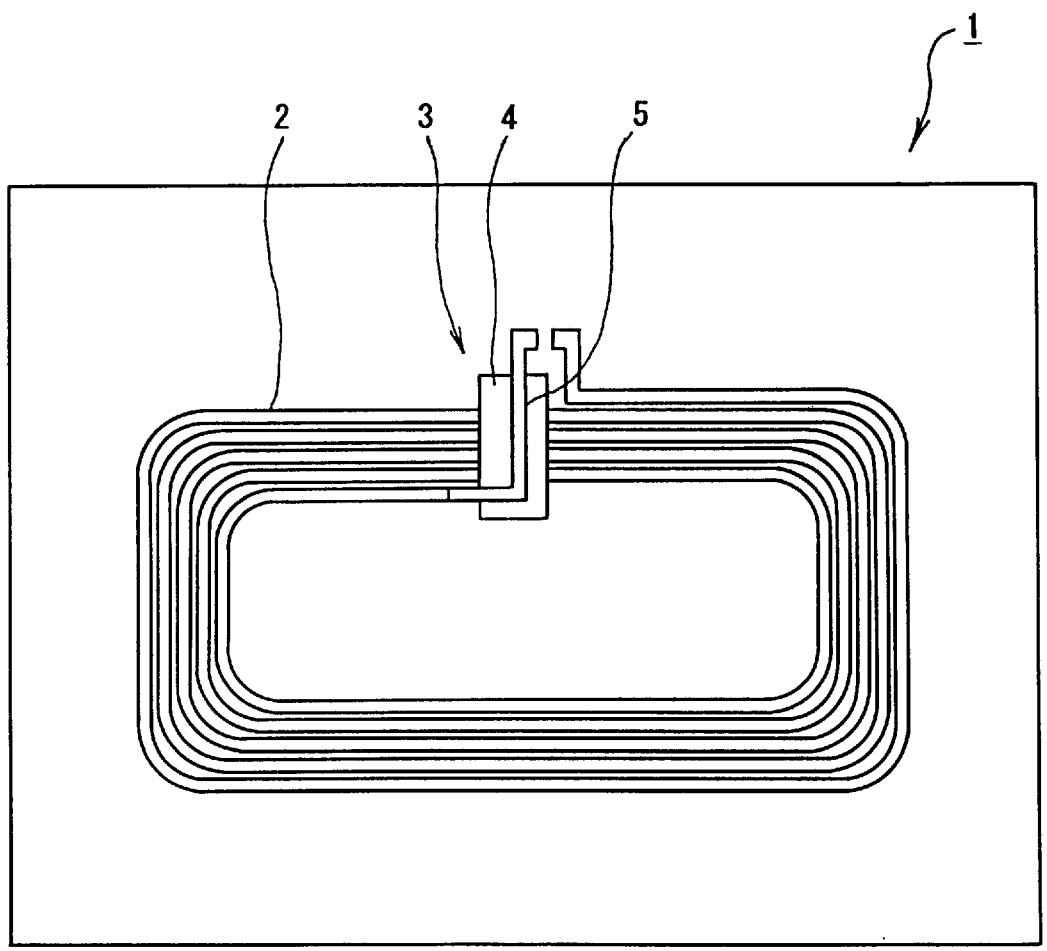
FIG. 4 is an explanatory drawing of a substrate supporting an antenna formed according to the present invention.

A second embodiment of a method of forming an antenna for a radio frequency identification medium according to the invention will now be explained with reference to FIG. 4.

In the antenna-forming method of this embodiment, a paper is used as the substrate 1 for mounting of the IC chip. As shown in FIG. 4, a coiled main antenna member 2 of the antenna is first formed by printing with the conductive paste. A screen printing method, for example, may be used for printing formation of the main antenna member 2 and for subsequent printing formation of a crossing wire section 5, which is explained later. After curing of the main antenna member 2, an insulating material 4 is formed on the appointed crossing wire sections 3. Next, the crossing wire section 5 is printed on the insulating material 4 in connection with one end of the main antenna member 2 using the conductive paste in the same manner as for the main antenna member 2. This is cured to obtain an antenna.

The insulating material 4 is a mixture of an epoxy-based ultraviolet curing resin and insulating inorganic fine particles of silica, talc, alumina or the like. The mixture is printed and exposed to ultraviolet rays for curing. The insulating material 4 is coated to a coating thickness of about 15 μm, for example, and cured by ultraviolet irradiation at 4 kW for an irradiation time of about 1 second. Since the insulating material is thus formed with only slight exposure to ultraviolet rays, this contributes to better efficiency of the entire formation process for the radio frequency identification medium.

The insulating material is highly viscous (10,000 mPa or greater) even with the epoxy-based ultraviolet curing resin alone, and it may be used directly so long as the substrate is non-permeable (non-penetrable), such as PET. When a paper material is used as the substrate, silica may be added for thickening to prevent permeation into the substrate.

Silica was therefore used as insulating inorganic fine particles in the insulating material, and an insulating property evaluation test was conducted with different amounts of added silica. As indicated below, the amounts of added silica for the test were from 2 to 8 parts with respect to 100 parts of the epoxy-based ultraviolet curing resin.

The materials used were Adekaoptomer KS830 and Adekaoptomer KS871 by Asahi Denka Kogyo, KK. for the epoxy-based ultraviolet curing resin, and Aerosil 200 (mean particle size: 0.015 pm) by Nihon Aerosil, KK. for the silica.

After forming the main antenna member, the insulating material was coated onto the main antenna member to a coating thickness of 10–20 μm, and cured by ultraviolet irradiation (output: 4 kW, irradiation time: approx. 1 second). A crossing wire section was formed by printing thereover and cured to form an antenna in connection. Ten (10) such antennas were fabricated and their resistance was measured.

The resistance was judged on a scale level, and in the table, ⊚ indicates that all ten were judged as having a satisfactory condition of insulation, ○ indicates that 8–9 were judged as insulated, Δ indicates that 5–7 were judged as insulated, and × indicates that 4 or fewer were judged as insulated.

TABLE 11

| Epoxy-based ultraviolet curing resin | Silica | resin/silica | Insulation condition |
|---|---|---|---|
| KS871 | Aerosil 200 | 100/8 | ⊚ |
| | | 100/5 | ○ |
| | | 100/2 | × |
| KS830 | Aerosil 200 | 100/8 | ⊚ |
| | | 100/5 | ⊚ |
| | | 100/3 | Δ |

[Effect]

In this experiment it was confirmed that insulating materials comprising mixtures of epoxy-based ultraviolet curing resins and silica can be used as insulating materials for crossing wire sections in non-contact IC modules. It was also found, as shown by the results in Table 11, that when the insulating materials are coated onto paper substrates, using silica at 3 to 8 parts with respect to 100 parts of the epoxy-based ultraviolet curing resin is even more satisfactory for formation of the insulated sections. Very small silica such as Aerosil 200 was found to be particularly effective as the silica. While this conclusion is not indicated above for the materials, it was confirmed that large silica of 1 μm or greater has less of a thickening effect and has a minimal effect of improved fixing property since it is not incorporated into the fibers of the paper.

Third embodiment

Another embodiment of a method of forming a multi-layered circuit for a radio frequency identification medium according to the invention will now be explained.

As the multi-layered circuit according to the present invention, one having an antenna function is preferred. Accordingly, hereinbelow the formation method therefor according to the present invention will be explained by exemplifying an antenna as the multi-layered circuit.

Specifically, the antenna is obtained by alternate printing of a conductive layer and an insulating layer on a paper as a substrate. The substrate on which the multi-layered circuit is formed is not specifically limited and may be one described above. However, the substrate is preferably paper and the paper used may be a publicly known type. It may even by synthetic paper made from a polymer starting material or paper that is surface coated with an organic material or inorganic material. The antenna is formed by screen printing of one of the conductive pastes described above on the substrate. The printing method is not limited to screen printing.

The insulating layer is formed by screen printing of a publicly known insulating paste containing insulating particles, a binder and various additives. The printing method is not limited thereto.

The insulating particles in the insulating paste may be of silica, alumina, talc, etc. Silica fine particles with a mean particles size of no greater than 1 pm are particularly preferred since they contribute to thickening of the ink and maintenance of the coating film shape. However, the insulating particles are not essential if the insulating property can be guaranteed without them.

The insulating paste used may be any publicly known material such as a permeation drying type, solvent evaporating type or thermosetting type. By including a photosetting resin in the binder it is possible to improve efficiency by further shortening the curing time as a photosetting insulating paste.

The photosetting resin and photosetting initiator that may be included in the insulating paste may be the same ones as used in the conductive paste. Particularly preferred among them are combinations of epoxy resins and cationic photosetting catalysts that have excellent insulating properties.

FIGS. 5(A) to 5(F) illustrate a method of laminating a circuit. First, paper 11 is prepared as the substrate (FIG. 5(A)), and a circuit 12 is formed by printing thereon using a conductive paste (FIG. 5(B)). After drying and curing, the sections to be connected to the circuit situated on the upper layer side, for example the end sections of the circuit 12 as illustrated, are designated as the non-printing sections 13 and the insulating paste is printed onto the other regions to form an insulating layer 14 (FIG. 5(C)). After drying and curing of this insulating layer 14, another circuit 12' is formed by printing onto the insulating layer 14 in connection with the aforementioned non-printed sections 13. This circuit 12' is then dried and cured (FIG. 5(D)). The end sections of the circuit 12' (the sections to be connected to the circuit on the upper layer side) are designated as non-printed sections 13', and then an insulating layer 14' is formed onto the other regions and dried and cured (FIG. 5(E)). In addition, another circuit 12" is formed by printing onto the insulating layer 14' in connection with the non-printed sections 13', and this circuit 12' is dried and cured (FIG. 5(F)). This procedure is repeated for alternate printing of the circuits 12 and insulating layers 14 to obtain a printed wiring sheet 15 with an antenna connected to a multi-layered circuit. Post-processing of the printed wiring sheet 15 can then give a radio frequency identification medium.

The electrical connection method by multi-layering of alternate circuits used here was according to a method whereby partial non-printed sections are formed to allow connection while the other sections are totally insulated. However, the present invention is not limited to the method illustrated here. The insulating layer may be partial, or for more reliable connection at the non-printed sections, a conductive layer may be newly printed over the non-printed sections. Also, the order does not necessarily need to be as illustrated.

Various devices, such as IC chips, may be mounted onto the multi-layered circuit formed by the method of the invention, by connection according to publicly known methods including wire bonding (WB), anisotropic conductive films (ACF), anisotropic conductive paste (ACP), non-conductive paste (NCP), cream solder balls, etc. If necessary, the connection site may be protected or reinforced by a publicly known underfill material or potting material.

Also, the entire multi-layer-mounted circuit section may be coated with a coating material or film to protect it from external factors.

Examples of multi-layered circuit formation according to the invention are provided below, with the understanding that the scope of the invention is in no way limited thereby.

(Preparation of photosetting conductive paste)

A mixture (F) of Silvest E-20 and Silvest TCG-7 silver powders, both by Tokuriki Honten, KK. (at a weight ratio of 8:2) a mixture (G) of the epoxy limonene dioxide by Elf Atochem and Adekaoptomer SP-170 and Adekaoptone CP-66 by Asahi Denka Kogyo, KK. (mixed ratio: 100:3:3) and (H) the polyester Vylon 500 by Toyo Boseki, KK. were combined so that (F), (G) and (H) were in a weight ratio of 65:30:5, and further kneading with a triple roll produced a photosetting conductive paste (I) to be used for the invention.

(Preparation of photosetting insulating paste)

Adekaoptomer KS-871 by Asahi Denka, KK. as the photosetting resin composition and Aerosil 200CF by Nihon Aerosil, KK. as the silica fine particles were mixed in a weight ratio of 92:8 and kneaded with a kneader to obtain a photosetting insulating paste (J) to be used for the invention.

EXAMPLE 76

Figure 6A:
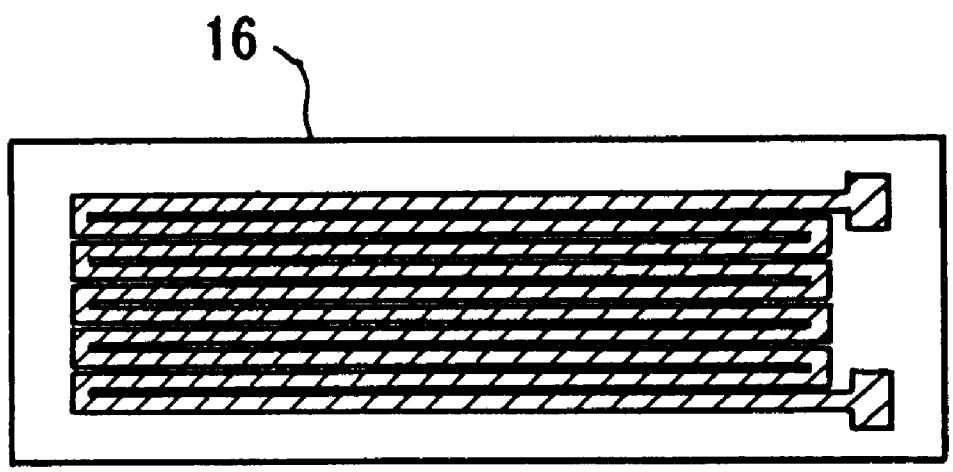
FIGS. 6(A) and 6(B) are illustrations of printing plates for printing conductive paste and insulating paste used for the method according to the present invention.
Figure 6B:
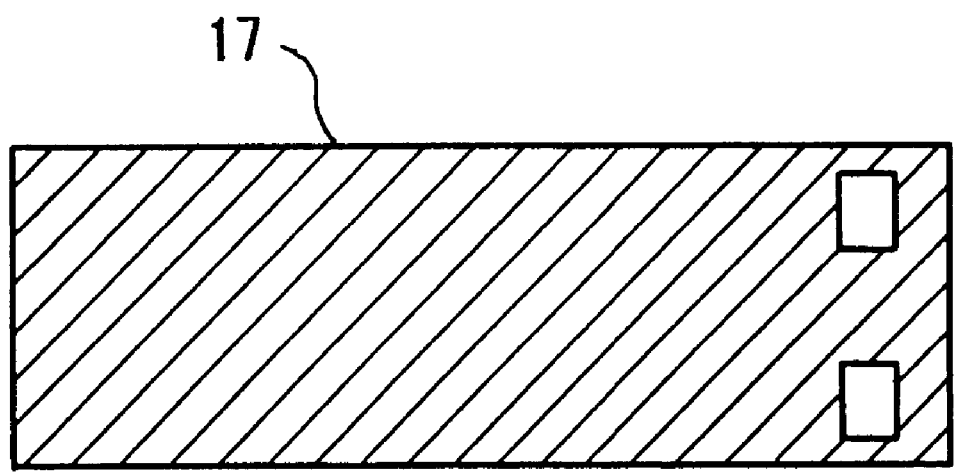
Figure 7:
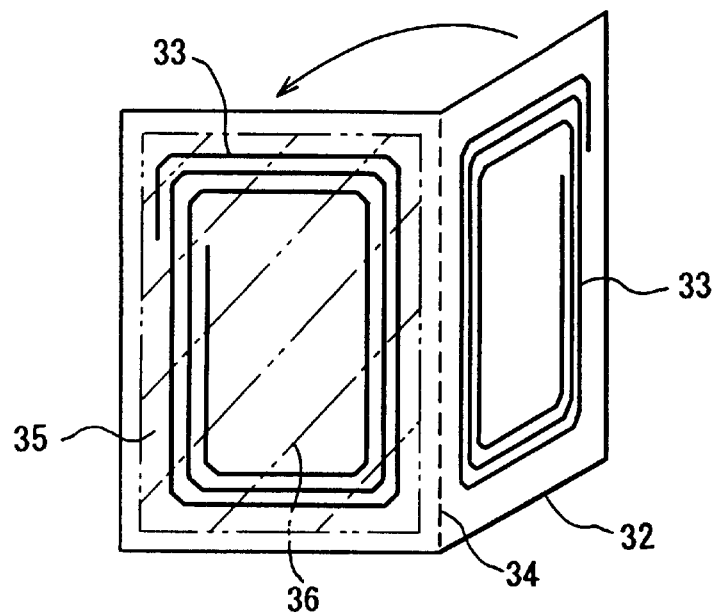
FIG. 7 is an illustration of an example of an antenna-forming method according to the present invention.
Figure 8:
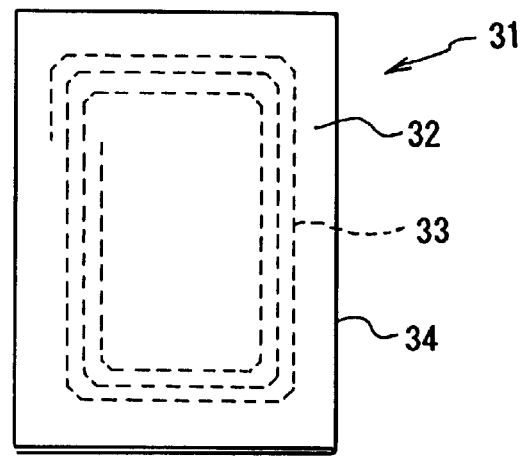
FIG. 8 is an illustration of the antenna having been formed according to the present invention.

The paper used as the substrate was NPI-55 by Nippon Seishi, KK. and the conductive paste used was LS-415-M by Asahi Chemical Laboratories, KK. Screen printing was carried out with the plate 16 shown in FIG. 6(A) made of Tetoron™ and having a 180 mesh and capable of printing in a thickness of 15 μm. Drying and curing were carried out in a hot air oven at 150° C. for 30 minutes. CR44B by Asahi Chemical Laboratories, KK. was then used as an insulating paste for double printing of a pattern with the plate 17 shown in FIG. 6(B) made of Tetoron™ and having a 180 mesh and capable of printing in a thickness of 15 μm, and drying and curing were carried out under the same conditions. A circuit pattern was formed as a triple conductive layer (circuit) through a process involving "conductive layer printing with plate 16 and drying"→"insulating layer printing with plate 17 and drying"→"conductive layer printing with plate 16 and drying".

EXAMPLE 77

The paper used as the substrate was NPI-55 by Nippon Seishi, KK. and the conductive paste used was the photosetting conductive paste (I) prepared above. Screen printing was carried out with the plate 16 shown in FIG. 6(A) made of Tetoron™ and having a 180 mesh and capable of printing in a thickness of 15 μm. Curing was carried out by light irradiation at a cumulative dose of 5000 mJ/cm² (measured in a wavelength range of 300–500 nm) using a 160 W/cm metal halide lamp. The aforementioned photosetting insulating paste (J) was then used as an insulating paste for single printing of a pattern with the plate 17 shown in FIG. 6(B) made of Tetoron™ and having a 180 mesh and capable of printing in a thickness of 15 µm, and curing was carried out again by light irradiation at a cumulative dose of 500 mJ/cm² (measured in a wavelength range of 300–500 nm) using the same light irradiation apparatus. A circuit pattern was formed as a triple conductive layer (circuit) through a process involving "conductive layer printing with plate 16 and curing"→"insulating layer printing with plate 17 and curing"→"conductive layer printing with plate 16 and curing".

The following are comparative examples with only a single conductive circuit layer.

COMPARATIVE EXAMPLE 12

The paper used as the substrate was NPI-55 by Nippon Seishi, KK. and the conductive paste used was LS-415C-M by Asahi Chemical Laboratories, KK. Screen printing was carried out with the plate 16 shown in FIG. 6(A) made of Tetoron™ and having a 180 mesh and capable of printing in a thickness of 15 µm. Drying and curing were carried out in a hot air oven at 150° C. for 30 minutes.

COMPARATIVE EXAMPLE 13

The paper used as the substrate was NPI-55 by Nippon Seishi, KK. The conductive paste used was the photosetting conductive paste (I) prepared above. Screen printing was carried out with the plate 16 shown in FIG. 6(A) made of Tetoron™ and having a 180 mesh and capable of printing in a thickness of 15 µm. Curing was carried out by light irradiation at a cumulative dose of 5000 mJ/cm² (measured in a wavelength range of 300–500 nm) using a 160 W/cm metal halide lamp.

In Example 76, Example 77, Comparative Example 12 and Comparative Example 13, the surface resistances were measured at the respective circuit terminals. The results are shown in Table 12. As seen from Table 12, better results were obtained in Examples 76 and 77 than in Comparative Examples 12 and 13. The shaded regions of the plates 16, 17 in FIG. 6 are the sections bearing the paste.

TABLE 12

|  | Surface resistance at circuit terminal (mΩ/sq.) |
|---|---|
| Example 76 | 7 |
| Example 77 | 14 |
| Comparative Example 12 | 19 |
| Comparative Example 13 | 40 |

[Effect]

The method described above realizes parallel and serial circuits in limited spaces, or large-volume data storage, and further a radio frequency identification medium with a paper substrate mounting an IC chip.

Fourth embodiment

The following explanation concerns a fourth embodiment of an antenna forming method designed with a thicker conductive layer and lower resistance value, without requiring increased manufacturing costs or preparation efforts.

In the illustration, reference numeral 31 designates a thin antenna. First, a pair of antenna loops 33 are formed on one side of a sheet-like substrate made of paper or a thin film. Each antenna loop 33 is composed of a conductive layer made by screen printing the aforementioned conductive paste. The antenna loops 33 are formed in a symmetrical pattern at symmetrical locations on either side of a folding section 34 formed at a position dividing the substrate 32 into two parts.

Next, glue 36 consisting of an adhesive or tackifier is evenly applied onto one of the antenna loop-formed surfaces 35. The substrate 32 is then folded at the folding section 34 so that the antenna loops 33 are on the inside. The antenna loops 33 matching each other by folding are laid over each other through the glue 36. A prescribed pressure is then applied to attach and join the two antenna loops 33 to produce an antenna 31.

Figure 9:
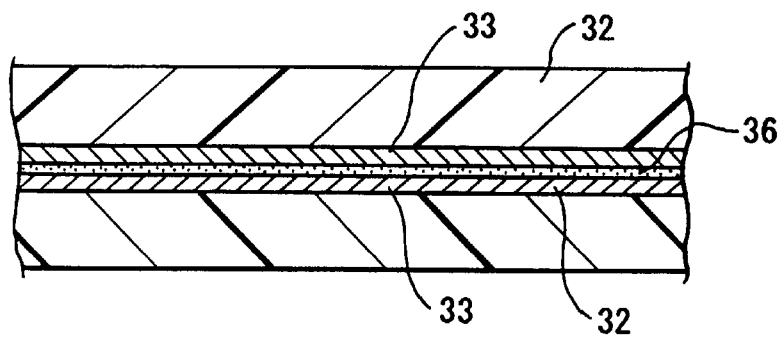
FIG. 9 is a cross-sectional illustration of a part of antenna formed according to the present invention.

FIG. 9 is a cross-sectional illustration of a part of the antenna 31 obtained by the method described above. By attaching the matching antenna loops 33 with the glue 36, the matching antenna loops 33 are directly joined at intricate sections forming a state of continuity. The matching pair of antenna loops 33 are thus integrated to form a single antenna loop with a thicker conductive layer. This gives an antenna 31 with a lower resistance value.

For greater clarification of the gist of the invention, this drawing does not show the mounting section on which the IC chip is mounted or the connecting wire section situated across part of the loop.

The glue used may be spray glue 55 manufactured by Sumitomo- 3M, KK. One of the other glues mentioned below may also be applied onto the surface to be provided with an antenna loop by a spray method, screen printing method or gravure coating method. It may also be applied onto the entirety of one surface of the substrate on which the antenna loop is formed. In addition to coating as a sheet, it may also be applied in dot or fine line pattern.

Synthetic resin latexes

Acronyl YJ2301D by Mitsubishi Kagaku BASF, KK.

AE200, AE517 by Nihon Gosei Gomu, KK.

Vinibran 270 by Nisshin Kagaku Kogyo, KK.

Superflex SF110 by Daiichi Kogyo Seiyaku, KK. Natural rubber latexes

Polybutadiene, polyvinyl ether, polyvinyl alcohol, styrene or maleic acid dissolved in a solvent.

When the glue 36 applied for attachment is thin (about 3 g/cm²), light pressure (about 2 Kg/cm²) is sufficient for attachment. When the glue 36 is thick, both heat and pressure may be applied (for example, 30 seconds at 5 Kg/cm², 130° C.)

A thin antenna was then obtained by an antenna loop in the shape of a 1 mm×1000 mm comb-shaped pattern, by the attachment method described above. Table 13 shows the results of measuring the resistance values for an attached thin antenna obtained with light pressure applied for the attachment (simple attachment), and for an attached thin antenna obtained with application of heat and pressure (heating/pressure) and antenna loops prior to attachment (antenna 1, antenna 2). The forms of glue application were thin application, thick application and pattern coating, respectively. The conductive ink was LS415C-M by Asahi Chemical Laboratories, KK., and the antenna loops were formed by screen printing in a thickness of 15 µm.

TABLE 13

|  | Glue/thin application | Glue/thick application | Pattern coating |
|---|---|---|---|
| Antenna 1 | 20 | 20 | 20 |
| Antenna 2 | 20 | 20 | 20 |

TABLE 13-continued

|  | Glue/thin application | Glue/thick application | Pattern coating |
|---|---|---|---|
| Simple attachment | 10 | 20 | 10 |
| Heating/pressure | 10 | 10 | 10 |

(units: Ω)

As shown in Table 13 above, the resistance values are lowered by the attachment. of particular note, when heat and pressure were applied the resistance values were half the resistance values of the antennas alone in all cases. These were resistance values in accordance with Ohm's Law for parallel connections, and thus an effect of lower resistance values for the thin antennas was confirmed. Because of a lack of continuity between the two antenna loops after simple attachment with the glue by thick application, the resistance value of one of the antenna loops was measured.

[Effect]

Thin antennas with low resistance values can be obtained by this very simple method that involves laying two antenna loops together by folding and attaching them with glue. It is also possible to reliably lay the two antenna loops together without mismatching. Thin antennas can therefore be obtained without trouble.

By attaching and joining two antenna loops with the same resistance value by heat and pressure it is possible to obtain a thin antenna with ½ the resistance value. Thus, even when the antenna loops are formed using inexpensive materials having high resistance values, the resistance value of the resulting thin antenna is reduced to half. It is thereby possible to achieve a property similar to a simple antenna made of an expensive material with a low resistance value. Each antenna loop may be fabricated with its own specific resistance value. The antenna resistance value can therefore be determined based on Ohm's Law for resistance in parallel connections. It therefore becomes easier to set resistance values for thin antennas in conformity with desired uses, without having to provide numerous types of conductive materials for the antenna loops.

Figure 10:
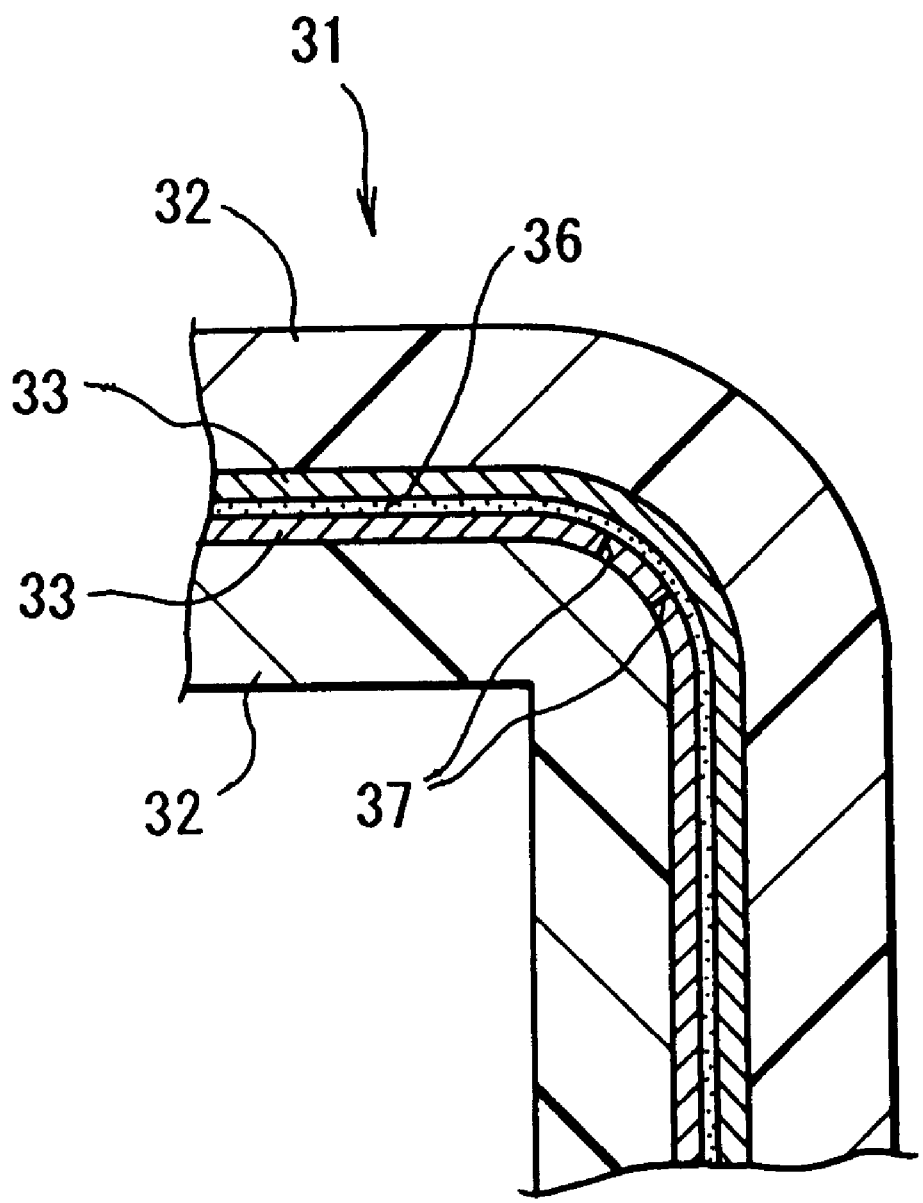
FIG. 10 is a cross-sectional illustration of a bent section of the antenna formed according to the present invention.

Moreover, by laying together two sheet-like substrates to attach and join the antenna loops of each substrate as described above, resistance of the antenna to bending is increased. This will become readily apparent from the drawing. FIG. 10 shows a bent section where the antenna 31 has been folded. As seen in this illustration, a crack 37 has occurred in the antenna loop 33 where it has been folded. However, since the matching antenna loops 33 are directly joined as explained above, continuity for the antenna loop 33 in which the crack 37 has occurred is provided by its matching antenna loop 33. Continuity of the entire antenna 31 is thus properly ensured.

<<IC chip mounting method>>

The following method may be mentioned as a method for mounting an IC chip on an antenna formed by any of the above-mentioned antenna-forming methods.

Adhesive joints are formed onto an antenna-provided substrate at the mounting position on which an IC chip is to be situated on the substrate, by a printing method using a conductive adhesive substance (K) at terminal sections corresponding to the terminals of the IC chip. Adhesive joints are formed by a printing method using an insulating adhesive substance (L) at the non-terminal sections. The IC chip is adhered onto the substrate by thermocompression bonding to achieve positional anchoring of the chip and connection reliability.

The substrate used may be one of those mentioned for the aforementioned substrate (E).

The antenna may be formed on the substrate by a publicly known method such as printing, using any of the aforementioned conductive pastes.

For the method of the invention, the conductive adhesive substance (K) and the insulating adhesive substance (L) are preferably selected from among adhesive substances having virtually no volatile substances that are emitted during thermocompression bonding, exhibiting good adhesion to the IC chip after heat treatment and maintaining reliability (for example, impact resistance, water resistance, humidity resistance, heat resistance, etc.) after mounting. They are also preferably adhesive substances with crosslinked structures from the standpoint of continuously and reliably maintaining the anchored state of the IC chip on the circuit, and their crosslinked structures are preferably formed by the heat treatment.

Since the conductive adhesive substance (K) guarantees conductive connectivity with the terminals of the IC chip, it contains conductive particles and a binder resin as essential components, and it is preferably a conductive paste with strong adhesion to both the antenna and the metal of the IC chip terminals.

The conductive particles will typically be a metal powder, especially silver powder. Conductive metals other than silver, such as gold, platinum, copper, nickel, cobalt, palladium, rhodium, etc. may also be used.

The insulating adhesive substance (L) has the function of positional anchoring of the IC chip by adhesion and of preventing short circuits between the conductive connections, as well as that of protecting the conductive connections from external shocks. It is therefore preferably composed of a resin with high adhesion to the metal, the substrate and the circuit on the substrate, with excellent insulating properties, and with the ability to absorb stress and strain generated by heat shock or physical shock. In cases where it is difficult to achieve insulation with the resin alone, an insulating filler, for example silica, alumina, glass, talc, rubber or the like, may be added thereto.

The resin which is an essential component of the conductive adhesive substance (K) or the insulating adhesive substance (L) may be a publicly known thermoplastic resin or thermosetting resin, or a combination of both.

The thermoplastic resin is not particularly restricted, and as examples there may be mentioned polyethylene, polypropylene, polystyrene, ABS resins, polymethyl methacrylate, polyvinyl chloride, polyvinylidene chloride, polyvinyl acetate, polyvinyl alcohol, polyacetal, polycarbonate, polyethylene terephthalate, polybutylene terephthalate, polyphenylene oxide, polysulfone, polyimide, polyethersulfone, polyallylate, polyether ether ketone, polyethylene tetrafluoride, silicone resins, etc. any of which may be used alone or in combinations of two or more.

The thermosetting resin composition is selected from among those that react without generating volatile components during the curing, and examples thereof include but are not limited to (1) glycidyl compounds such as glycidyl ethers of bisphenol A or bisphenol F, or liquid epoxy resins represented by 3,4-epoxycyclohexylmethyl-3,4-epoxycyclohexyl carboxylate, and amino compounds, phenol compounds, acid anhydride compounds, organic acid compounds or onium compounds, (2) liquid cyanic acid ester resins represented by 1,1-bis(4-cyanatophenyl)ethane, and metal salt catalysts, (3) bismaleimide or addition products of bismaleimide and diamine compounds, and amino compounds, allyl compounds or radical generators, (4) liquid allyl compounds represented by diallyl phthalate, and amino compounds or radical generators, (5) triallyl isocyanurate or triallyl cyanurate and amino compounds or peroxides, (6) polyvalent active hydrogen compounds represented by polyethylene glycol, hexamethylene glycol and glycerin, and isocyanate compounds, (7) liquid acrylate compounds such as polyethyleneglycol diacrylate, trimethylolpropane alkylene oxide-modified triacrylates, etc. and radical generators, (8) vinyl group-containing liquid polyolefins and radical generators, (9) vinylsilane compounds and SiH group-containing compounds, and platinum catalysts, etc.

The conductive adhesive substance (K) and insulating adhesive substance (L) may include a solvent so long as the solvent can be removed prior to thermocompression bonding of the IC chip. The added solvent may be a publicly known one. However, in order to avoid residue in the system after the curing reaction, it preferably has a boiling point of no higher than 250° C. Examples include hydrocarbon solvents such as toluene, cyclohexane, methylcyclohexane, n-hexane and pentane; alcohols such as isopropyl alcohol and butyl alcohol; ketones such as cyclohexanone, methyl ethyl ketone, methyl isobutyl ketone, diethyl ketone and isophorone; esters such as ethyl acetate, propyl acetate and butyl acetate; glycol monoethers and their acetates, such as ethyleneglycol monomethyl ether, propyleneglycol monoethyl ether, diethyleneglycol monomethyl ether and 3-methoxy-3-methylbutyl acetate; as well as mixed solvents comprising two or more of these.

The adhesive substance may be previously placed in a semicured state by heating, electromagnetic irradiation or electron beam irradiation prior to mounting the chip. In the case of light irradiation in the wavelength range of from visible light to ultraviolet light, a publicly known photosetting resin composition is added. Examples thereof include combinations of epoxy resins and photocationic generators, or acrylate resins and photoradical generators.

Publicly known additives such as release agents, surface treatment agents, fillers, pigments, dyes and the like may also be added. As release agents there may be mentioned waxes, zinc stearate, etc., and as surface treatment agents there may be mentioned silane coupling agents. As fillers there may be mentioned silica, alumina, talc, clay, etc.

All of the respective components of the conductive adhesive substance (K) and insulating adhesive substance (L) may be mixed to make a homogenized varnish, or an even dispersion prepared by kneading by appropriate publicly known means such as a kneader or triple roll. The adhesive substance is prepared as a viscous fluid in a temperature range which does not degrade the substrate during printing. This substance is applied onto the substrate after forming the circuit by a printing method. The printing is carried out by a publicly known method, but screen printing is particularly preferred.

The adhesive substances (K) and (L) have a degree of reactivity adjusted so as to anchor the IC chip connections under the final thermocompression bonding conditions for mounting of the chip, preferably within a temperature range of 40–250° C., within a time range of 0.1–120 seconds and within a pressure range of 0.1–0.5 MPa.

An example of a mounting method will now be explained in detail with reference to FIG. 11(A) to FIG. 11(E) and FIG. 12(A) to FIG. 12(F). FIGS. 12(A) to (F) are lateral cross-sections showing simplified views of the mounting position shown in FIGS. 11(A) to 11(E).

The following steps are carried out to mount an IC chip 23 at the mounting position A of a substrate 22 on which a circuit 21 has been formed as an antenna on the surface by the method described above.

(i) The circuit 21 is formed on the substrate 22 (FIG. 11(A), FIG. 12(A)).

(ii) The insulating adhesive substance (L) is used for application by a printing method to form an insulating adhesive section 25 which does not cover the sections of the terminals 24 (two shown here) of the IC chip 23 (FIG. 11(B), FIG. 12 (B)). Before moving to the next step, the insulating adhesive section 25 may be subjected to treatment such as heating, electromagnetic irradiation or electron beam irradiation, or it may be moved directly to the next step.

(iii) The conductive adhesive substance (K) is used for application by a printing method to form terminal adhesive sections 26 on the circuit 21 to a greater thickness than the insulating adhesive section 25 so as to ensure contact with the terminals 24 of the IC chip 23. That is, (the height d of the insulating adhesive section from the circuit)<(the height d' of the terminal adhesive sections from the circuit) (FIG. 11(C), FIG. 12(C)). Before moving to the next step, the terminal adhesive sections 26 may be subjected to treatment such as heating, electromagnetic irradiation or electron beam irradiation, or it may be moved directly to the next step. In any case, it is necessary to completely eliminate any volatile components before moving to the next step.

(iv) The IC chip 23 is placed by an appropriate method so as to match the positions of the insulating adhesive section 25 and the terminal adhesive sections 26 formed in the steps of (ii) and (iii) above 11(FIG. (D), FIG. 12(D)).

(v) An appropriate apparatus is used for thermocompression bonding of the IC chip 23 (FIG. 11(E), FIG. 12(E)). This is preferably carried out in such a manner that the adhesive sections 25, 26 are within a temperature range of 40–250° C., and within a time range of 0.1–120 seconds and within a pressure range of 0.1–0.5 MPa. After the thermocompression bonding, the reaction may be completely terminated by postcuring with heat or electromagnetic irradiation.

This completes mounting of the IC chip 23 (FIG. 12(F)).

In order to protect the mounted portion of the IC chip, the mounting procedure according to the invention may be followed by coating of the entirety or part of mounted portion with a potting material or coating material.

[Effect]

It is thus possible to simplify the manufacturing process for a radio frequency identification medium with a mounted IC chip.

While the presently preferred embodiments of the present invention have been shown and described, it will be understood that the present invention is not limited thereto, and that various changes and modifications may be made by those skilled in the art without departing from the scope of the invention as set forth in the appended claims.

What is claimed is:

1. A photosetting conductive paste having a surface resistance of no greater than 200 mΩ/sq. upon curing by light irradiation, characterized in that said paste comprises conductive powder and a photosetting resin composition in a weight ratio of 50/50–95/5, and said conductive powder contains dendritic conductive powder and scaly conductive powder at 80% or greater of the total conductive powder, said dendritic conductive powder having a mean particle size of 0.05–1.0 $\mu$m, a specific surface area of 0.5–5.0 m$^2$/g and said scaly conductive powder having a mean particle size of 1.0–10.0 $\mu$m and a specific surface area of 0.5–5.0

$m^2/g$, wherein the weight ratio of said dendritic conductive powder and scaly conductive powder is 60/40–95/5.

2. A photosetting conductive paste according to claim 1, wherein said photosetting resin composition contains a mixture of an aromatic sulfonium salt initiator and a non-aromatic epoxy resin combined in a weight ratio of 0.01/100–10/100.

3. A photosetting conductive paste according to claim 1, wherein said photosetting resin composition contains a mixture of at least one selected from the group consisting of a thioxanthone derivative, a thiobenzophenone derivative, an anthraquinone derivative and an acylphosphine oxide derivative, and at least one selected from the group consisting of an acrylate and a methacrylate, combined in a weight ratio of 0.01/100–10/100.

4. A photosetting conductive paste according to claim 1, characterized by containing at least one processability of printing/bending ability improver selected from the group consisting of silica with a specific surface area of at least 100 $m^2/g$, an apparent specific gravity of no greater than 50 g/l and a mean primary particle size of no greater than 30 nm, a saturated polyester resin with a softening temperature of 100° C. or below and a number average molecular weight of 1000–50,000, a polyvinyl ether resin with a glass transition point (Tg) of –30° C. or below, and a phenoxy resin with a softening temperature of 100° C. or higher.

5. A photosetting conductive paste according to claim 2, wherein:

said photosetting resin composition contains a mixture of at least one selected from the group consisting of a thioxanthone derivative, a thiobenzophenone derivative, and at least one selected from the group consisting of an acrylate and a methacrylate, combined in a weight ratio of 0.01/100–10/100.

6. A photosetting conductive paste according to claim 2, characterized by containing at least one processability of printing/bending ability improver selected from the group consisting of silica with a specific surface area of at least 100 $m^2/g$, an apparent specific gravity of no greater than 50 g/l and a mean primary particle size of no greater than 30 nm, a saturated polyester resin with a softening temperature of 100° C. or below and a number average molecular weight of 1000–50,000, a polyvinyl and a phenoxy resin with a softening temperature of 100° C. or higher.

* * * * *

UNITED STATES PATENT AND TRADEMARK OFFICE
CERTIFICATE OF CORRECTION

PATENT NO. : 6,165,386
DATED : December 26, 2000
INVENTOR(S) : Yasuhiro Endo et al.

It is certified that error appears in the above-identified patent and that said Letters Patent is hereby corrected as shown below:

Column 9,
Line 17, "KK. ps" should read -- KK. --;

Column 10,
Line 42, "NFI-55" should read -- NPI-55 --;

Column 14,
Line 60, "mpa·s" should read -- mPa·s --;

Column 19,
Line 15, "mpa·s" should read -- mPa·s --;

Column 20,
Line 27, "mPa—s" should read -- mPa·s --;
Line 29, "mpa·s" should read -- mPa·s --;

Column 21, Table 7,
Line M-408, under Column 66, delete "40" and insert -- - --;
Line M-408, under Column 67, delete "-" and insert -- 40 --;

Column 28,
Line 22, "pm" should read -- µm --;

Column 29,
Line 24, "pm" should read -- µm --;

UNITED STATES PATENT AND TRADEMARK OFFICE
CERTIFICATE OF CORRECTION

PATENT NO. : 6,165,386
DATED : December 26, 2000
INVENTOR(S) : Yasuhiro Endo et al.

It is certified that error appears in the above-identified patent and that said Letters Patent is hereby corrected as shown below:

<u>Column 38,</u>
Line 9, "derivative, and" should read -- derivative, an anthraquinone derivative and an acylphosphine oxide derivative, and --;
Line 20, "polyvinyl and" should read -- polyvinyl ether resin with a glass transition point (Tg) of -30ºC or below, and --.

Signed and Sealed this

Seventeenth Day of June, 2003

JAMES E. ROGAN
*Director of the United States Patent and Trademark Office*